US011993247B2

(12) United States Patent
Sawada

(10) Patent No.: US 11,993,247 B2
(45) Date of Patent: May 28, 2024

(54) INTELLIGENT POWER MODULE, ELECTRIC VEHICLE OR HYBRID VEHICLE, AND METHOD OF ASSEMBLING INTELLIGENT POWER MODULE

(71) Applicant: ROHM CO., LTD., Kyoto (JP)

(72) Inventor: Hideki Sawada, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 17/666,295

(22) Filed: Feb. 7, 2022

(65) Prior Publication Data

US 2022/0161779 A1 May 26, 2022

Related U.S. Application Data

(63) Continuation of application No. 15/599,865, filed on May 19, 2017, now Pat. No. 11,273,818.

(30) Foreign Application Priority Data

May 24, 2016 (JP) ................. 2016-103345

(51) Int. Cl.
*B60W 20/10* (2016.01)
*H01L 23/36* (2006.01)
(Continued)

(52) U.S. Cl.
CPC ............. *B60W 20/10* (2013.01); *H01L 23/36* (2013.01); *H01L 23/4006* (2013.01);
(Continued)

(58) Field of Classification Search
CPC .... B60W 20/10; H01L 23/36; H01L 23/4006; H01L 23/46; H01L 25/16–162;
(Continued)

(56) References Cited

U.S. PATENT DOCUMENTS

| 2008/0158824 A1 | 7/2008 | Aoki et al. |
| 2009/0002956 A1* | 1/2009 | Suwa ................. H01R 4/30 |
| | | 361/728 |

(Continued)

FOREIGN PATENT DOCUMENTS

| JP | 2007234753 A | 9/2007 |
| JP | 2008-125240 A | 5/2008 |

(Continued)

OTHER PUBLICATIONS

"ISO26262-1/Road vehicles—Functional safety", ISO (International Organization for Standardization), prepared by Technical Committee ISO/TC 22, Road vehicles, Subcommittee SC 3, Electrical and electronic equipment, 2011, 23 pages.

(Continued)

*Primary Examiner* — Hal Kaplan
*Assistant Examiner* — Swarna N Chowdhuri
(74) *Attorney, Agent, or Firm* — HSML P.C.

(57) ABSTRACT

An intelligent power module includes: a heat radiation device; an attachment frame disposed on a mounting surface of the heat radiation device; a power semiconductor module mounted on the attachment frame and configured to seal a semiconductor device; and a drive circuit part mounted on the power semiconductor module via a heat insulating sheet and configured to drive the power semiconductor module.

14 Claims, 40 Drawing Sheets

(51) Int. Cl.
*H01L 23/40* (2006.01)
*H01L 23/46* (2006.01)
*H01L 23/473* (2006.01)
*H01L 25/16* (2023.01)
*H05K 7/14* (2006.01)
*H05K 7/20* (2006.01)

(52) U.S. Cl.
CPC ............ *H01L 23/46* (2013.01); *H01L 23/473* (2013.01); *H01L 25/16* (2013.01); *H01L 25/162* (2013.01); *H05K 7/1432* (2013.01); *H05K 7/209* (2013.01); *H05K 7/20927* (2013.01); *H01L 2924/13055* (2013.01); *H01L 2924/13091* (2013.01)

(58) Field of Classification Search
CPC ........... H01L 2924/13055; H01L 2924/13091; H05K 7/1432; H05K 7/209; H05K 7/20927
USPC .................................................. 307/9.1, 10.1
See application file for complete search history.

(56) References Cited

U.S. PATENT DOCUMENTS

2009/0039504 A1* 2/2009 Kimura ................... H01L 23/16
257/E23.101
2011/0199800 A1* 8/2011 Yahata .................... B60L 3/003
363/131
2013/0154081 A1* 6/2013 Kadoguchi ............. H01L 24/37
257/712

FOREIGN PATENT DOCUMENTS

| JP | 2009-224445 | 10/2009 |
| JP | 2009-232655 A | 10/2009 |
| JP | 2012028398 A | 2/2012 |
| JP | 2014-067902 A | 4/2014 |
| JP | 2014220319 A | 11/2014 |
| JP | 2014225571 A | 12/2014 |
| WO | 2008/078544 A1 | 7/2008 |
| WO | 2013/001999 | 1/2013 |
| WO | 2013/054408 | 4/2013 |

OTHER PUBLICATIONS

Office Action issued in Japanese Patent Application No. 2016-103345, dated Feb. 28, 2020, with English machine translation; 12 pages provied.
Office Action issued in corresponding Japanese Application No. 2016-103345 dated Oct. 6, 2020, with English translation.
Office Action issued in Japanese Patent Application No. 2021-120988, dated Nov. 29, 2022, with Machine translation (16 pages).

* cited by examiner

FIG. 13A
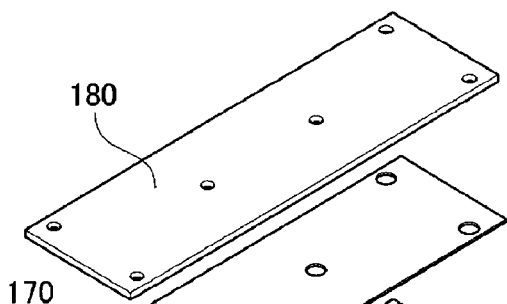
FIG. 13B
FIG. 13C
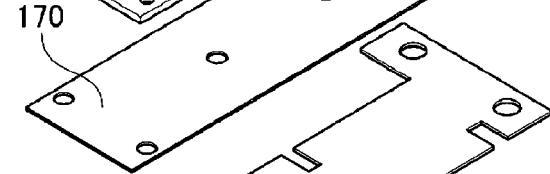
FIG. 13D
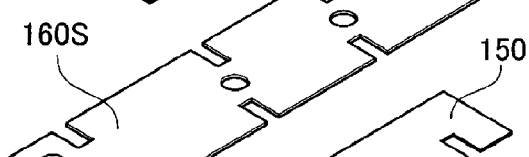
FIG. 13E
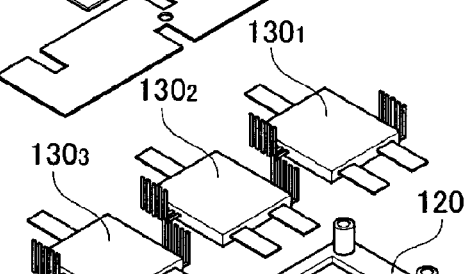
FIG. 13F
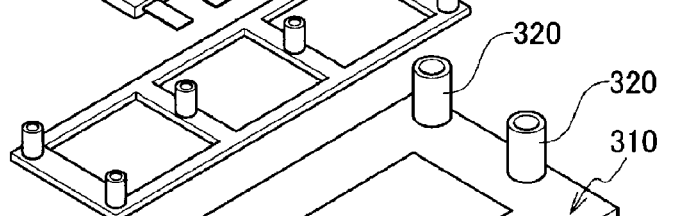
FIG. 13G
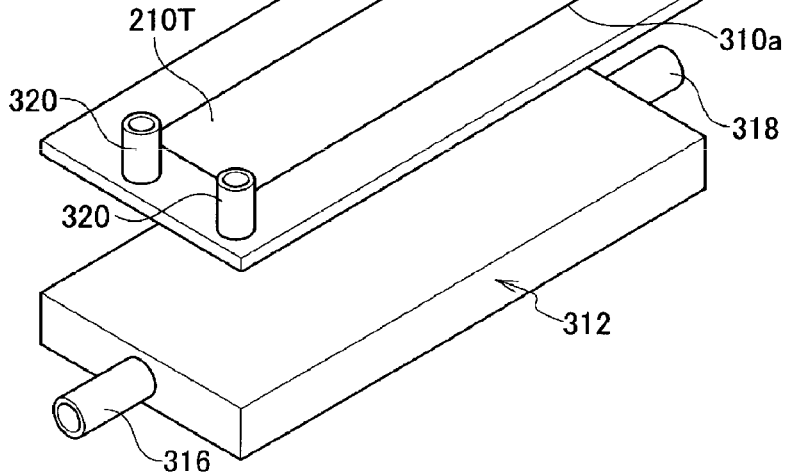

FIG. 17A
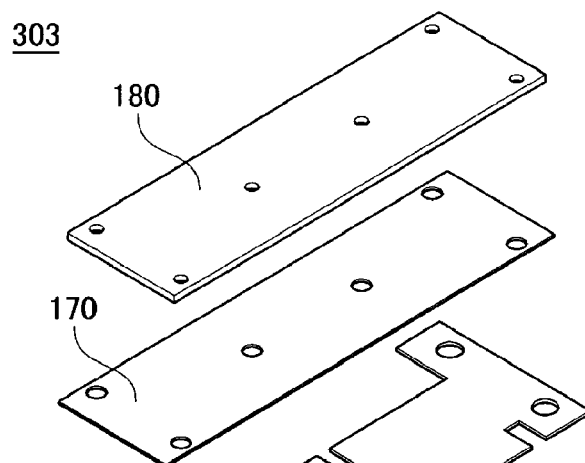
FIG. 17B
FIG. 17C
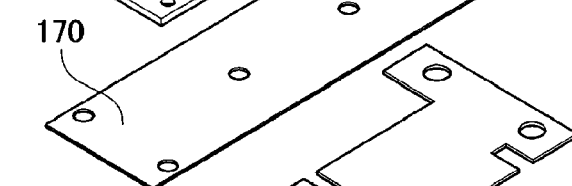
FIG. 17D
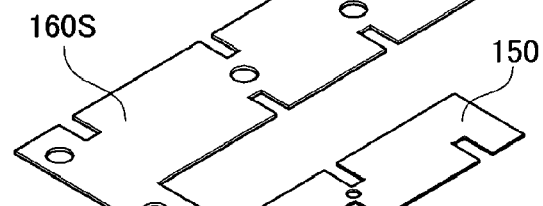
FIG. 17E
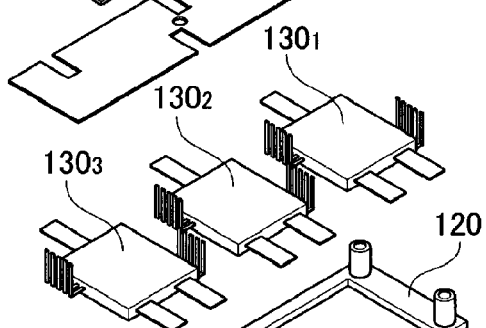
FIG. 17F
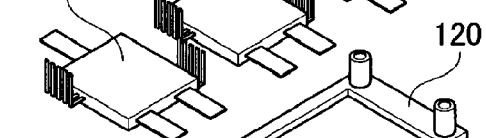
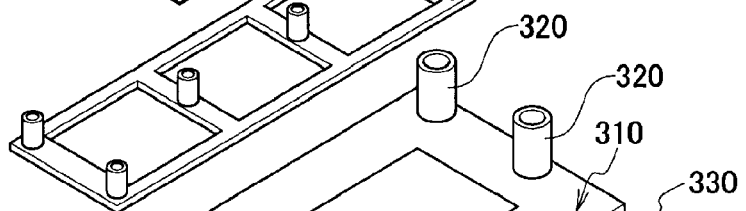
FIG. 17G
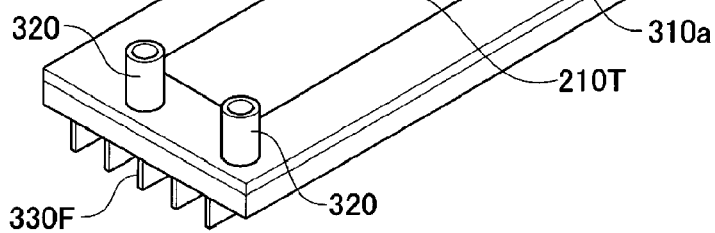

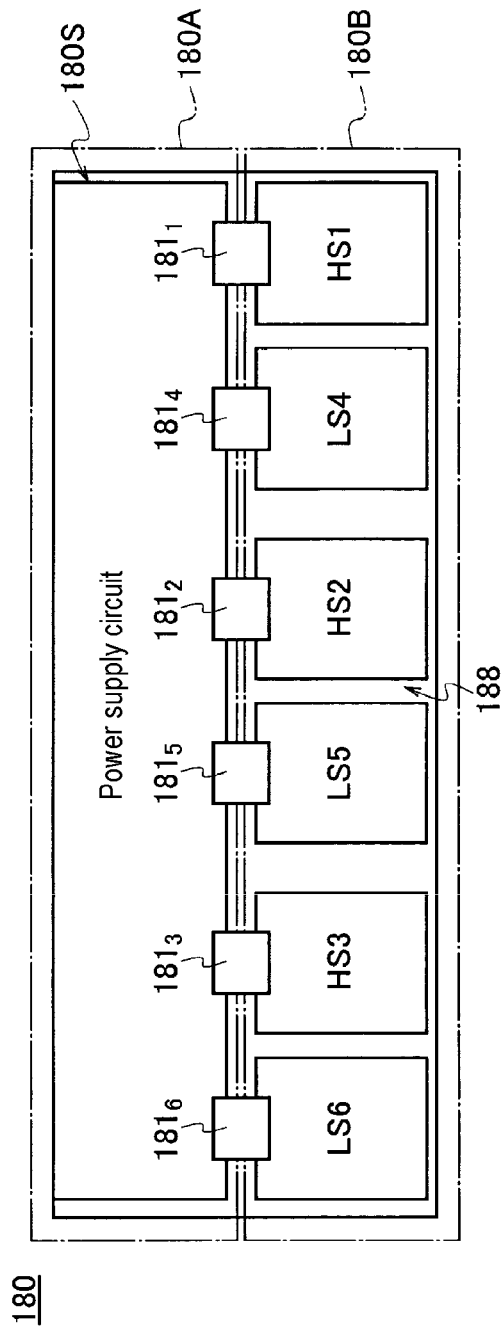

INTELLIGENT POWER MODULE, ELECTRIC VEHICLE OR HYBRID VEHICLE, AND METHOD OF ASSEMBLING INTELLIGENT POWER MODULE

CROSS-REFERENCE TO RELATED APPLICATION(S)

This application is a continuation of U.S. application Ser. No. 15/599,865, filed on May 19, 2017, which was based upon and claims the benefit of priority from Japanese Patent Application No. 2016-103345, filed on May 24, 2016, the entire contents of which are incorporated herein by reference.

TECHNICAL FIELD

The present disclosure relates to an intelligent power module, an electric vehicle or a hybrid vehicle, and a method of assembling an intelligent power module.

BACKGROUND

Standards for safety functions for all parts mounted on a vehicle (for example, functions of failsafe, abnormality detection, safe stop, etc.) are being reviewed. In particular, most of vehicle-mounted devices are controlled electrically and electronically. Not only high performance and high functionality but also ensuring safety becomes an important need.

International standard ISO 26262, which systematically summarizes development methods and management methods for safe vehicle-mounted devices, has been formulated.

One semiconductor module applicable to vehicle-mounted devices is a power semiconductor module in which an outer periphery of a power element (chip) including a semiconductor device such as an insulated gate bipolar transistor (IGBT) or the like is molded with a resin. Since the semiconductor device generates heat in an operating state, it is typical that heat is dissipated by disposing a radiator such as a heat sink plane or fin on the back side of the semiconductor device, thereby cooling the semiconductor device.

In order to further enhance the heat radiation effect, there is also known an intelligent power module provided with a cooler and configured to cool the power semiconductor module with a coolant.

SUMMARY

The present disclosure provides some embodiments of an intelligent power module which is excellent in heat radiation characteristics, easy to modularize and suitable for miniaturization, an electric vehicle or a hybrid vehicle, and a method of assembling an intelligent power module.

According to one embodiment of the present disclosure, there is provided an intelligent power module, including: a heat radiation device; an attachment frame disposed on a mounting surface of the heat radiation device; a power semiconductor module mounted based on the attachment frame and configured to seal a semiconductor device; and a drive circuit part mounted on the power semiconductor module via a heat insulating sheet and configured to drive the power semiconductor module.

According to another embodiment of the present disclosure, there is provided an intelligent power module, including: a heat radiation device; an attachment frame disposed on a mounting surface of the heat radiation device; a plurality of power semiconductor modules, each power semiconductor module being mounted based on the attachment frame and configured to seal a semiconductor device; and a drive circuit part mounted on the power semiconductor modules via a heat insulating sheet, and configured to drive the power semiconductor module, wherein each of the plurality of power semiconductor modules constitutes a two-in-one module, and the plurality of power semiconductor modules constitutes a six-in-one module type inverter or converter.

According to a further embodiment of the present disclosure, there is provided an electric vehicle or a hybrid vehicle equipped with the intelligent power module.

According to a still further embodiment of the present disclosure, there is provided a method of assembling an intelligent power module, including: disposing an attachment frame on a mounting surface of a heat radiation device; mounting a power semiconductor module, which seals a semiconductor device, based on the attachment frame; and mounting a drive circuit part, which drives the power semiconductor module, on the power semiconductor module via a heat insulating sheet.

BRIEF DESCRIPTION OF THE DRAWINGS

FIG. 7A is a bird's-eye view of a drive circuit part, FIG. 7B is a bird's-eye view of a heat radiation sheet, FIG. 7C is a bird's eye view of a presser plate, FIG. 7D is a bird's-eye view of a heat insulating sheet, FIG. 7E is a bird's eye view of the power semiconductor module, FIG. 7F is a bird's-eye view of an attachment frame, and FIG. 7G is a bird's-eye view of a heat radiation device.

FIG. 9A is a bird's-eye view of a drive circuit part, FIG. 9B is a bird's-eye view of a heat radiation sheet, FIG. 9C is a bird's eye view of a heat radiation plate, FIG. 9D is a bird's-eye view of a heat insulating sheet, FIG. 9E is a bird's eye view of a power semiconductor module, FIG. 9F is a bird's-eye view of an attachment frame, and FIG. 9G is a bird's-eye view of a heat radiation device.

FIGS. 13A to 13G are schematic exploded configuration views of the intelligent power module according to the third embodiment. FIG. 13A is a bird's-eye view of a drive circuit part, FIG. 13B is a bird's-eye view of a heat radiation sheet, FIG. 13C is a bird's eye view of a presser plate, FIG. 13D is a bird's-eye view of a heat insulating sheet, FIG. 13E is a bird's eye view of a power semiconductor module, FIG. 13F is a bird's-eye view of an attachment frame, and FIG. 13G is a bird's-eye view of a heat radiation device (a heat radiation plate and a cooler).

FIGS. 17A to 17G are schematic exploded configuration views of the intelligent power module according to the modification of the third embodiment. FIG. 17A is a bird's-eye view of a drive circuit part, FIG. 17B is a bird's-eye view of a heat radiation sheet, FIG. 17C is a bird's eye view of a presser plate, FIG. 17D is a bird's-eye view of a heat insulating sheet, FIG. 17E is a bird's eye view of a power semiconductor module, FIG. 17F is a bird's-eye view of an attachment frame, and FIG. 17G is a bird's-eye view of a heat radiation device (a heat radiation plate and a radiator).

FIGS. 20A and 20B show a configuration example of a drive circuit part applicable to the intelligent power module in a power control unit of an electric vehicle or a hybrid vehicle equipped with the intelligent power module according to the first embodiment. FIG. 20A is a schematic view showing a planar pattern configuration on a front side, and FIG. 20B is a schematic view penetratively showing a planar pattern configuration on a back side.

FIG. 23A is a circuit expression view of a SiC MOSFET of a two-in-one module, and FIG. 23B is a circuit expression view of an IGBT of a two-in-one module.

FIG. 24A is a schematic sectional structural view of a SiC MOSFET, and FIG. 24B is a schematic sectional structural view of an IGBT.

FIG. 29A shows a circuit configuration example in which a SiC MOSFET is applied and a snubber capacitor is connected between a power supply terminal PL and a ground terminal NL, and FIG. 29B shows a circuit configuration example in which an IGBT is applied and a snubber capacitor is connected between a power supply terminal PL and a ground terminal NL.

DETAILED DESCRIPTION

Figure 1:
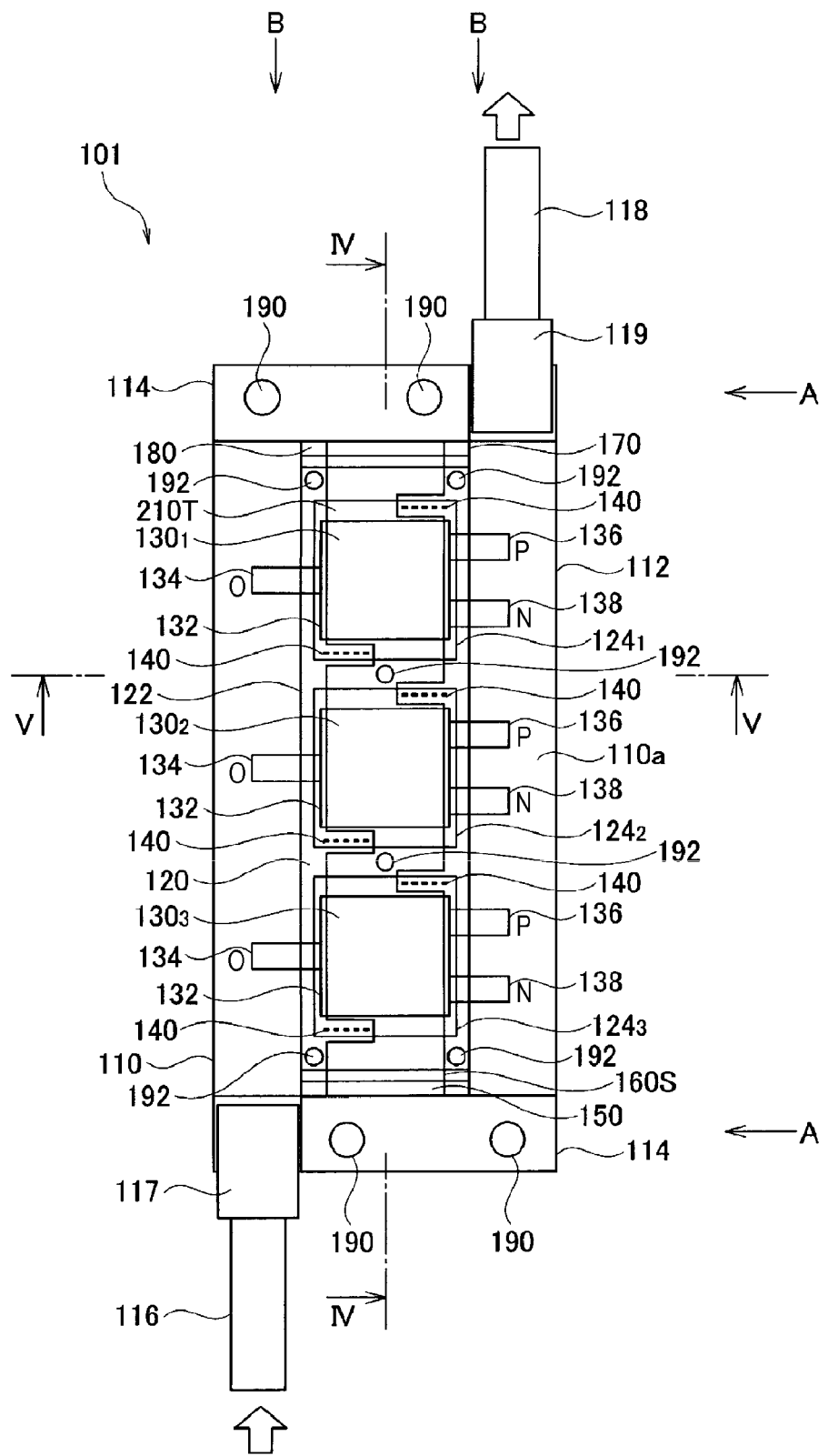
FIG. 1 is a plan view showing a schematic configuration of an intelligent power module according to a first embodiment.

Next, the present disclosure will be described with reference to the drawings. In the drawings described below, the same or similar parts are designated by the same or similar reference numerals. However, it should be noted that the plan view, the side view, the bottom view, the sectional view and the like are schematic and further that the relationship between the thickness and the plane dimension of each component is different from actual thicknesses and dimensions. Therefore, the specific thickness and dimension should be determined with reference to the following description. In addition, it is a matter of course that the portions differing in mutual dimensional relationships and ratios are included in the drawings.

In addition, the embodiments described below exemplify apparatuses and methods for embodying the technical idea, and do not specify the material, shape, structure, arrangement and the like of each component. The embodiments may be differently modified in the claims.

First Embodiment (Schematic Configuration of Intelligent Power Module)

Figure 7:
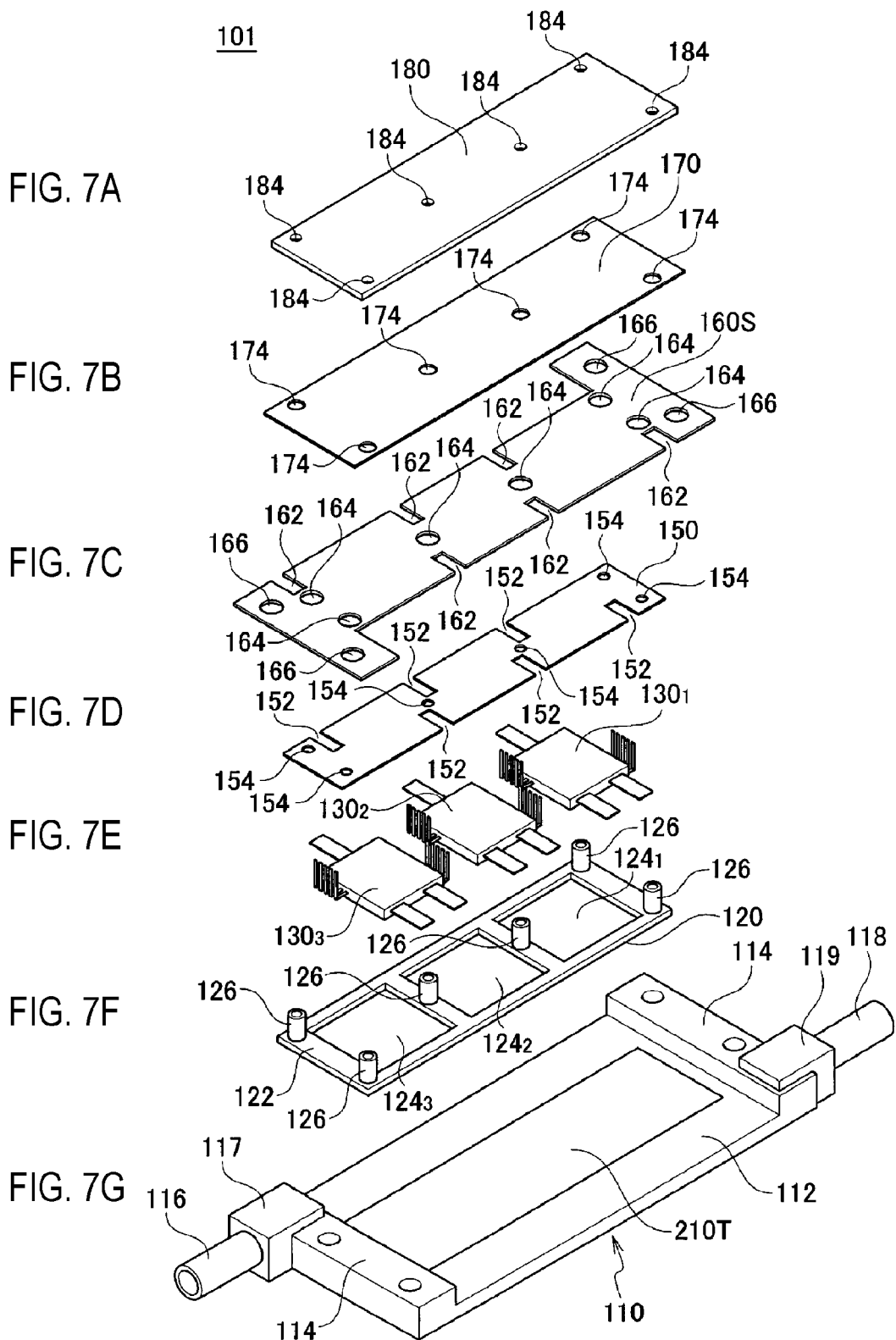
FIGS. 7A to 7G are schematic exploded configuration views of the intelligent power module according to the first embodiment.

A planar structure of an intelligent power module (IPM) 101 according to a first embodiment is represented as shown in FIG. 1. In FIG. 1, a part of a drive circuit part 180 and the like are shown as being transparent. A schematic exploded configuration view thereof is shown in FIG. 7.

Figure 2:
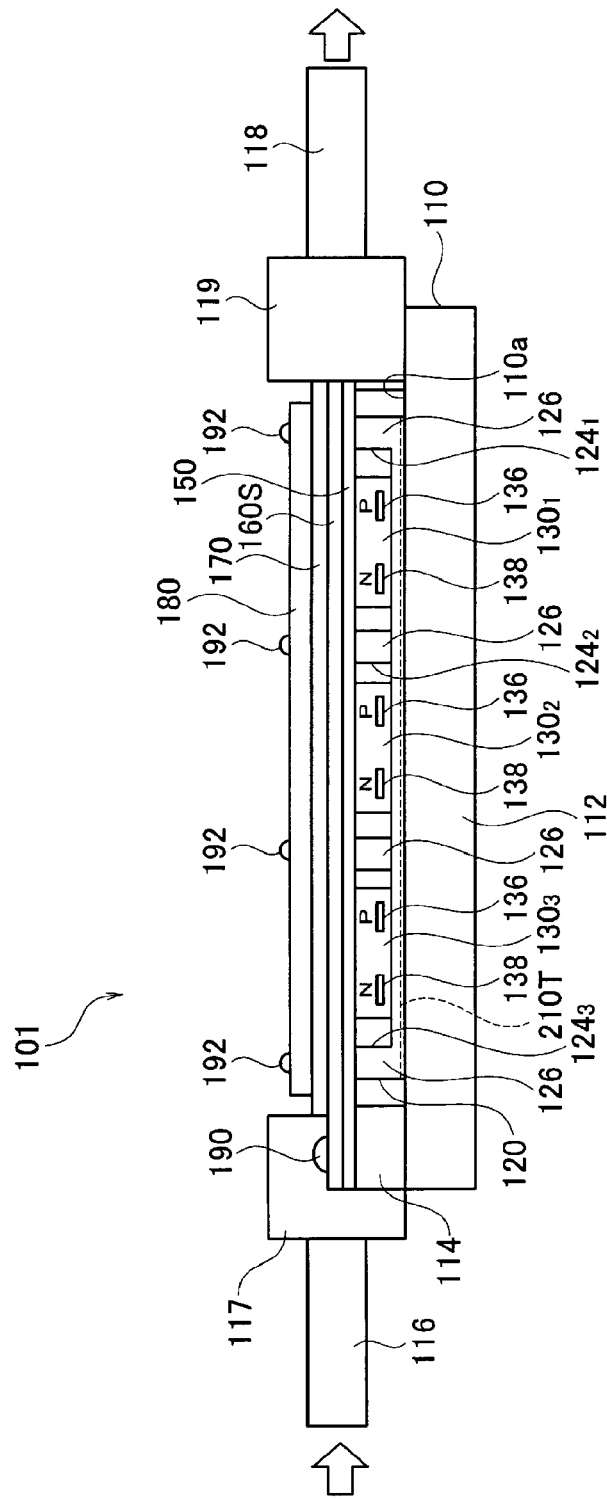
FIG. 2 is a side view showing the schematic configuration of the intelligent power module according to the first embodiment.
Figure 3:
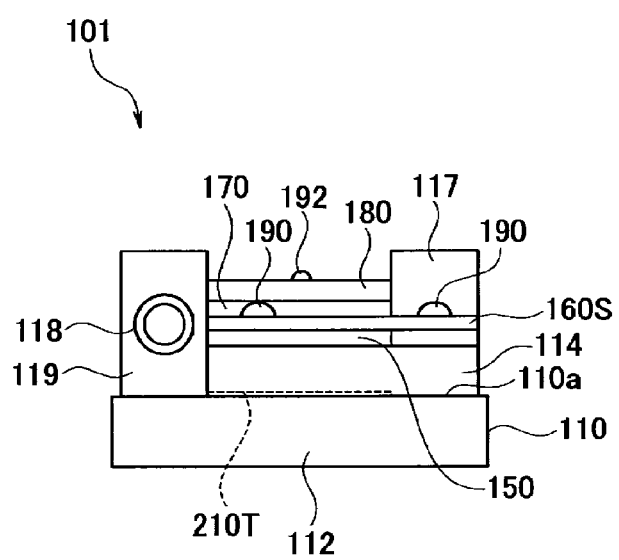
FIG. 3 is another side view showing the schematic configuration of the intelligent power module according to the first embodiment.
Figure 4:
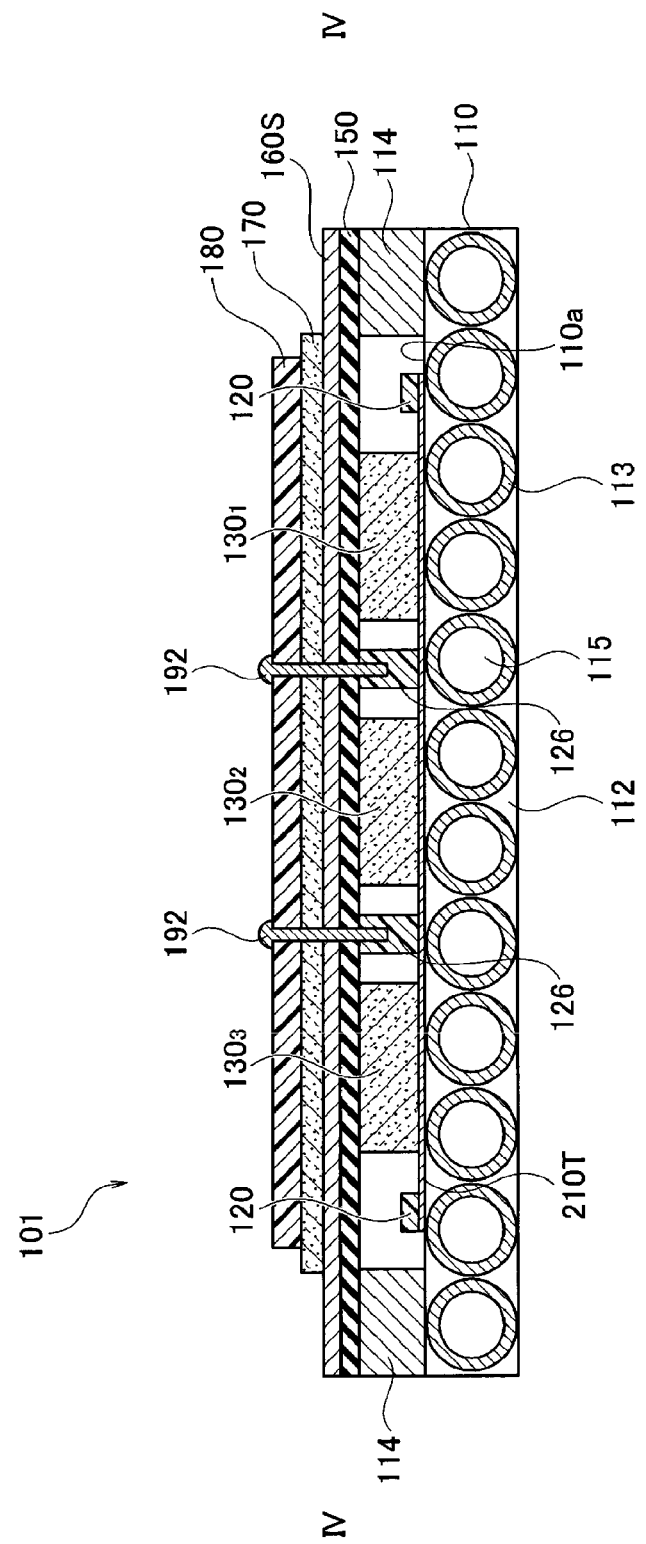
FIG. 4 is a view showing main parts of the configuration of the intelligent power module according to the first embodiment and is a schematic sectional structural view taken along line IV-IV in FIG. 1.
Figure 5:
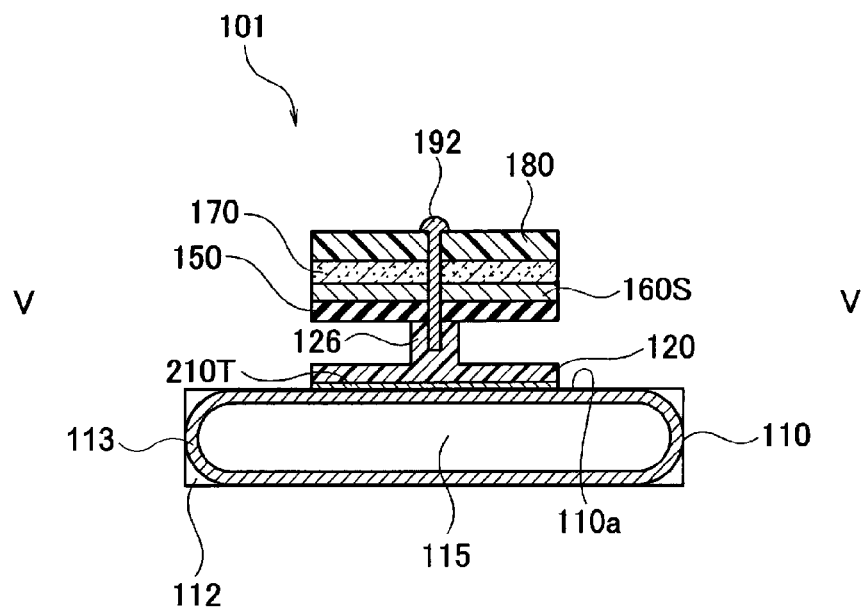
FIG. 5 is a view showing main parts of the configuration of the intelligent power module according to the first embodiment and is a schematic sectional structural view taken along line V-V in FIG. 1.

One side structure seen from the direction of arrow A in FIG. 1 is represented as shown in FIG. 2, and the other side structure seen from the direction of arrow B in FIG. 1 is represented as shown in FIG. 3. In addition, a sectional structure taken along line IV-IV in FIG. 1 is represented as shown in FIG. 4, and a sectional structure taken along line V-V in FIG. 1 is represented as shown in FIG. 5.

In FIGS. 1 to 5, the IPM 101 includes a heat radiation device (for example, a heat radiation plate (cooling plate) such as a heat sink made of aluminum (Al) or the like, or a cooler such as a water jacket (WJ) or the like) 110, an attachment frame 120 disposed on a mounting surface 110a of the heat radiation device 110, and a plurality of (for example, three) power semiconductor modules 130 (molded power modules $130_1$, $130_2$ and $130_3$, hereinafter referred to as "each power semiconductor module $130_n$") mounted on the mounting surface 110a inside a frame body 122 using the attachment frame 120 as a guide member. The IPM 101 also includes a drive circuit part (gate drive substrate, for example, FR-4, 6 layer) 180 that is mounted on a package 132 of each power semiconductor module $130_n$ sequentially via a heat insulating sheet 150, a presser plate 160S, and a heat radiation sheet 170.

That is, the IPM 101 according to the first embodiment includes the heat radiation device 110, the attachment frame 120 disposed on the mounting surface 110a of the heat radiation device 110, the power semiconductor modules 130 ($130_1$, $130_2$ or $130_3$) mounted on the basis of the attachment frame 120 and configured to seal semiconductor devices, and the drive circuit part 180 mounted on the power semiconductor module 130 via a heat insulating sheet 150 and configured to drive the power semiconductor module 130.

The bonding position of each power semiconductor module $130_n$ mounted on the heat radiation device 110 is defined in advance by the attachment frame 120 disposed on the mounting surface 110a. As a result, it is possible to perform the assembling of the IPM 101 in an automated and unmanned manner (details will be described later).

Further, the attachment frame 120 has an effect of enhancing the rigidity of the heat radiation device 110 and suppressing the twisting and warping of the heat radiation device 110.

In this regard, a thermally conductive resin layer 210T formed of a thermally conductive resin as a joining member is provided in advance on the mounting surface 110a of the heat radiation device 110. The thermally conductive resin layer 210T may be formed of, for example, a sheet or pasty thermal compound or the like. In a case where the thermally conductive resin layer 210T is applied, each power semiconductor module $130_n$ mounted is not fixed but is kept in a held state (an unstably joined state).

In the IPM 101 according to the first embodiment, in order to solve the instability of the joining of each power semiconductor module $130_n$, the presser plate 160S is formed from a thin metal plate made of, for example, stainless steel having a spring property. This restricts unnecessary movement of each power semiconductor module $130_n$ such as a positional deviation or sinking at the time of assembly.

That is, the IPM 101 according to the first embodiment includes the joining member 210T configured to join each power semiconductor module $130_n$ on the mounting surface 110a of the heat radiation device 110. The joining member 210T includes a thermally conductive resin that holds each power semiconductor module $130_n$ on the mounting surface 110a of the heat radiation device 110.

The presser plate 160S formed of a thin metal plate having a spring property and configured to restrict movement of each power semiconductor module $130_n$ held by the thermally conductive resin layer 210T, and the heat radiation sheet 170, are provided on the heat insulating sheet 150 between the heat insulating sheet 150 and the drive circuit part 180.

(Detailed Configuration of Intelligent Power Module)

For example, the IPM 101 according to the first embodiment may constitute a six-in-one type switching module by adopting a two-in-one (2 in 1) type module for each power semiconductor module $130_n$ (details will be described later). In the IPM 101 constituting the switching module, it is possible to efficiently cool each power semiconductor module $130_n$ and to suppress deterioration of each power semiconductor module $130_n$ due to overheating.

That is, the IPM 101 according to the first embodiment includes the heat radiation device 110, the attachment frame 120 disposed on the mounting surface 110a of the heat radiation device 110, the power semiconductor module 130 (each power semiconductor module $130_n$) mounted on the basis of the attachment frame 120 and configured to seal semiconductor devices, and the drive circuit part 180 mounted on the power semiconductor module 130 via the heat insulating sheet 150 and configured to drive the power semiconductor module 130. A plurality of power semiconductor modules 130 may be disposed so as to be a two-in-one module, thereby constituting a six in-one module type inverter or converter.

In the following description, for example, a case where a six-in-one type switching module is configured by three two-in-one type semiconductor modules $130_1$, $130_2$ and $130_3$ will be described.

That is, as shown in FIG. 7G, for example, the heat radiation device 110 to which each power semiconductor module $130_n$ is mounted may be configured so that up to three power semiconductor modules $130_1$, $130_2$ and $130_3$ can be mounted on the heat radiation device 110. The heat radiating device 110 includes, for example, a heat radiation portion 112 formed with Al in a rectangular parallelepiped shape. A cooling pipe 113 is arranged in a bellows shape inside the heat radiation portion 112. The heat radiation device 110 is a water-cooled cooler that cools each power semiconductor module $130_n$ by circulating cooling water through a cooling passage 115 of the cooling pipe 113.

In the heat radiation device 110, a water supply portion 117 in which an introduction port 116 for introducing the cooling water into the cooling pipe 113 is disposed is provided in one end portion of the mounting surface 110a of the heat radiation portion 112, and a water discharge portion 119 in which a discharge port 118 for discharging the cooling water circulated through the cooling pipe 113 is disposed is provided in the other end portion of the mounting surface 110a.

In the heat radiation device 110, for example, the cooling water is introduced into the cooling pipe 113 from the introduction port 116 in the direction indicated by an arrow in FIG. 1 and FIG. 2. The cooling water passes through the cooling passage 115. The cooling water is discharged from the discharge port 118. Thus, the heat generation of the power semiconductor module 130 is efficiently cooled. As the cooling water, for example, water or a mixed solution obtained by mixing water and ethylene glycol at a ratio of 50% may be used.

The cooling pipe 113 of the heat radiation device 110 may be folded back in parallel with the lateral direction of the heat radiation portion 112, or may be folded back in parallel with the longitudinal direction of the heat radiation portion 112. Further, the cooling pipe 113 may be omitted, and the cooling water may be circulated throughout the inside of the heat radiation portion 112. In addition, the water supply portion 117 and the water discharge portion 119 are not limited to being disposed in parallel with the longitudinal direction of the heat radiation portion 112, but may be arranged in parallel with the lateral direction. Alternatively, the water supply portion 117 and the water discharge portion 119 may be provided so as to be able to rotate with respect to the heat radiation portion 112 at a predetermined angle.

On both ends of the heat radiation portion 112, there are provided pedestal portions 114 for fixing the heat insulating sheet 150 and the presser plate 160S with a fixture 190 such as a screw or the like. The mounting surface 110a for mounting each power semiconductor module $130_n$ is disposed between the pedestal portions 114.

Before mounting each power semiconductor module $130_n$, the thermally conductive resin layer 210T is formed in advance on the mounting surface 110a. A copper plate layer (not shown) as a heat spreader, which is exposed, for example, to a back side of each package 21 of each power semiconductor module $130_n$, is joined to the thermally conductive resin layer 210T.

As shown in FIGS. 1 to 5, the attachment frame 120 is, for example, a resin frame to which three power semiconductor modules $130_1$, $130_2$ and $130_3$ can be mounted. The attachment frame 120 includes three opening portions $124_1$, $124_2$ and $124_3$ formed inside the frame body 122. The size of the three opening portions $124_1$, $124_2$ and $124_3$ is approximately the same as or slightly larger than the size of the package 132 of each power semiconductor module $130_n$. As a result, each power semiconductor module $130_n$ is guided onto the mounting surface 110a of the heat radiation portion 112 based on the attachment frame 120, whereby each power semiconductor module $130_n$ is joined to the inside of each of the opening portions $124_1$, $124_2$ and $124_3$ defined by the frame body 122 via the thermally conductive resin layer 210T.

As shown in FIG. 7F, the attachment frame 120 includes a plurality of fixing portions 126 for fixing the heat insulating sheet 150, the presser plate 160S, the heat radiation sheet 170 and the drive circuit part 180 onto the frame body 122 by fixtures 192 such as screws or the like. For example, two fixing portions 126 are provided on each of both end portions of the frame body 122 in the lateral direction, and each fixing portion 126 is respectively provided between the opening portions $124_1$ and $124_2$ and between the opening portions $124_2$ and $124_3$.

Figure 6:
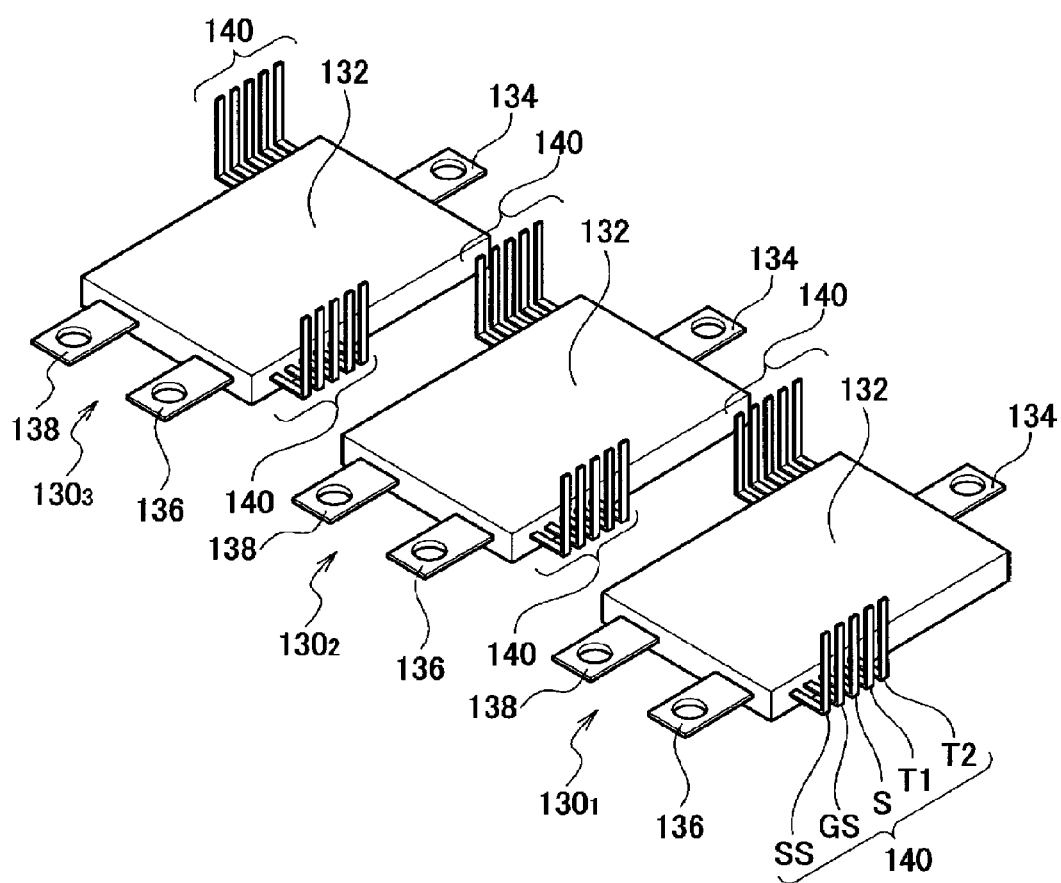
FIG. 6 is a bird's-eye view showing a schematic configuration of a power semiconductor module applicable to the intelligent power module according to the first embodiment.

As shown in FIG. 6, each power semiconductor module $130_n$ has the same structure and includes, for example, a rectangular package 132 in which the outer periphery of a power element (chip) including a semiconductor device (not shown) is sealed with a molding resin or the like. As an example, each power semiconductor module $130_n$ of a three-terminal type structure including three terminal electrodes (O, P and N) 134, 136 and 138 is shown herein. In addition to the three-terminal structure, for example, each power semiconductor module $130_n$ has two sets of five lead terminals (SS, GS, S, T1 and T2) 140.

The lead terminals 140 include, for example, a lead terminal SS for a source sense signal, a lead terminal GS for a gate sense signal, a lead terminal S for a source signal, and lead terminals T1 and T2 for temperature measurement signals for a thermistor or the like embedded in each power semiconductor module $130_n$.

That is, each power semiconductor module $130_n$ includes, for example, an output terminal electrode (O) 134 provided at a first side of the package 132, and a drain terminal electrode (P) 136 and a ground potential terminal electrode (N) 138 provided at a third side opposite to the first side of the package 132. The lead terminals (SS, GS, S, T1 and T2) 140 provided along a second side orthogonal to the first and third sides of the package 132 and the lead terminals (SS, GS, S, T1 and T2) 140 provided along a fourth side are respectively extended to the outside of the package 132 and are bent in an upward direction substantially perpendicular to the package 132.

Although details of each power semiconductor module $130_n$ will be described later, each power semiconductor module $130_n$ is of a two-in-one type having two embedded semiconductor devices.

In each power semiconductor module $130_n$, three terminal electrodes 134, 136, and 138 may be arranged at any side in the longitudinal direction of the heat radiation portion 112.

As shown in FIGS. 7D and 7C, the heat insulating sheet 150 and the presser plate 160S disposed on the package 132 have a plurality of opening portions 152 and 162 through which the respective lead terminals (SS, GS, S, T1 and T2) 140 of each power semiconductor module $130_n$ are respectively inserted. Similarly, the heat radiation sheet 170 and the drive circuit part 180 have a plurality of opening portions through which the respective lead terminals (SS, GS, S, T1 and T2) 140 are respectively inserted. For the sake of convenience, the illustration of the opening portions is omitted herein.

As shown in FIG. 7C, the presser plate 160S has a plurality of through-holes 166 through which the fixtures 190 are respectively inserted. Similarly, the heat insulating sheet 150 has a plurality of through-holes through which the fixtures 190 are respectively inserted.

As shown in FIGS. 7D to 7A, the heat insulating sheet 150, the presser plate 160S, the heat radiation sheet 170 and the drive circuit part 180 have a plurality of through holes 154, 164, 174 and 184 through which fixtures 192 are respectively inserted.

As the heat radiation sheet 170, for example, a heat radiation resin such as a silicon resin having a heat radiation property is used. By strongly joining the presser plate 160S and the drive circuit part 180 via the heat radiation sheet 170, a high heat radiation property of the drive circuit part 180 is secured. That is, a part of the heat generated in the drive circuit part 180 is absorbed by the heat radiation sheet 170 and is then radiated from the presser plate 160S.

The heat insulating sheet 150, the heat radiation sheet 170, and the drive circuit part 180 does not necessarily need to be arranged as an integrated structure with respect to each power semiconductor module $130_n$. For example, they may be divisionally disposed for each power semiconductor module $130_n$.

(Assembling of Intelligent Power Module)

The schematic exploded bird's-eye view configuration of the IPM 101 according to the first embodiment is represented as shown in FIGS. 7A to 7G.

A method of assembling the IPM 101 according to the first embodiment when manufacturing the same will now be described with reference to FIGS. 7A to 7G.

First, as shown in FIG. 7G, the heat radiation device 110 in which the thermally conductive resin layer 210T is formed on the mounting surface 110a of the heat radiation portion 112 is prepared in advance.

Next, as shown in FIG. 7F, the attachment frame 120 is disposed at a predetermined position on the mounting surface 110a on which the thermally conductive resin layer 210T is formed.

Next, each power semiconductor module $130_n$ is mounted in each of the opening portions $124_1$, $124_2$ and $124_3$ of the attachment frame 120 and is joined to the mounting surface 110a by the thermally conductive resin layer 210T. At this time, as shown in FIG. 7E, the respective lead terminals (SS, GS, S, T1 and T2) 140 of each power semiconductor module $130_n$ is bent in advance.

Next, as shown in FIG. 7D, the heat insulating sheet 150 is mounted on the package 132 of each power semiconductor module $130_n$ joined to the mounting surface 110a, so that the respective lead terminals (SS, GS, S, T1 and T2) 140 are respectively inserted through the opening portions 152.

Next, as shown in FIG. 7C, the presser plate 160S is mounted on the heat insulating sheet 150 so that the respective lead terminals (SS, GS, S, T1 and T2) 140 of each power semiconductor module $130_n$ are respectively inserted through the opening portions 162.

In this state, the presser plate 160S is fixed to the pedestal portions 114 having attachment holes by the fixtures 190 such as screws or the like, whereby each power semiconductor module $130_n$ can be fixed to the mounting surface 110a provided with the thermally conductive resin layer 210T. That is, each power semiconductor module $130_n$ is pressed against the mounting surface 110a provided with the thermally conductive resin layer 210T by the presser plate 160S having a spring property. Thus, even in the case where the thermally conductive resin layer 210T is adopted as a joining member, the subsequent assembling processes, for example, the process of mounting the drive circuit part 180 and the like, can be performed in a good state in which each power semiconductor module $130_n$ is stably fixed.

Next, as shown in FIG. 7B, the heat radiation sheet 170 is mounted on the presser plate 160S so that the respective lead terminals (SS, GS, S, T1 and T2) 140 of each power semiconductor module $130_n$ are respectively inserted through the opening portions thereof (not shown).

Next, as shown in FIG. 7A, the drive circuit part 180 is mounted on the heat radiation sheet 170 so that the respective lead terminals (SS, GS, S, T1 and T2) 140 of each power semiconductor module $130_n$ are respectively inserted through the opening portions thereof (not shown). The drive circuit part 180 is connected to the respective lead terminals (SS, GS, S, T1 and T2) 140 of each power semiconductor module $130_n$ as necessary.

Finally, the drive circuit part 180, the heat radiation sheet 170, the presser plate 160S and the heat insulating sheet 150 are collectively fixed to the fixing portions 126 of the frame body 122 of the attachment frame 120 by the fixtures 192 such as screws or the like, whereby the IPM 101 shown in FIGS. 1 to 5 is completed.

As described above, according to the IPM 101 of the first embodiment, for example, the joining position of each power semiconductor module $130_n$ mounted on the heat radiation device 110 is defined in advance on the mounting surface 110a by the attachment frame 120. Thus, each power semiconductor module $130_n$ can be mounted on the mounting surface 110a in a highly accurate and automated manner.

That is, the method of assembling the IPM 101 according to the first embodiment includes a process of attaching the attachment frame 120 onto the mounting surface 110a of the heat radiation device 110, a process of mounting the power semiconductor module 130 based on the attachment frame 120 to seal semiconductor devices, and a process of mounting the drive circuit part 180 for driving the power semiconductor module 130 on the power semiconductor module 130 via the heat insulating sheet 150.

In addition, the method of assembling the IPM 101 according to the first embodiment further includes a process of forming the thermally conductive resin layer 210T, on the heat insulating sheet 150, for holding the power semiconductor module 130 on the mounting surface 110a, a process of disposing the presser plate 160S for restricting movement of the power semiconductor module 130 held by the thermally conductive resin layer 210T, and a process of disposing the heat radiation sheet 170 on the presser plate 160S.

(Automatic Assembling of Intelligent Power Module)

Figure 8:
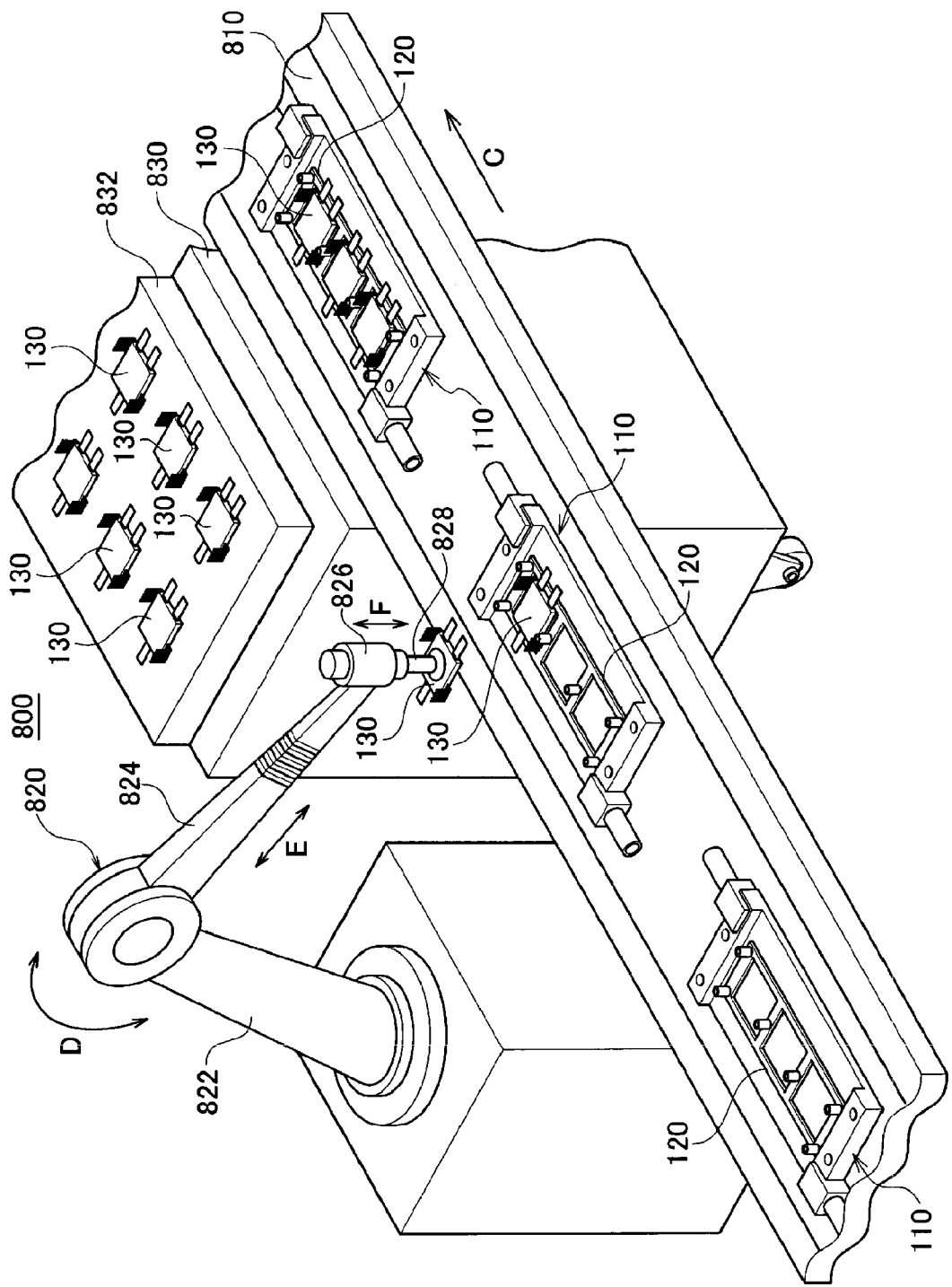
FIG. 8 is a schematic bird's-eye configuration view of an automatic assembling apparatus applicable to manufacture of the intelligent power module according to the first embodiment.

In the assembling of the IPM 101 according to the first embodiment, the schematic bird's eye view configuration when the power semiconductor module 130 is automatically mounted on the heat radiation device 110 by an automatic assembling apparatus 800 is represented as shown in FIG. 8.

As shown in FIG. 8, the automatic assembling apparatus 800 including, for example, a conveyance path 810, a robot arm 820 and a workbench 830 automatically mounts the power semiconductor module 130 on the heat radiation device 110.

The conveyance path 810 conveys, for example, a plurality of heat radiation devices 110 in which the attachment frame 120 has been disposed in advance on the thermally conductive resin layer 210T on the mounting surface 110a, in the direction of arrow C in the drawing at a constant interval and a constant speed.

The robot arm 820 includes, for example, a first arm portion 822, a second arm portion 824 and a working unit 826. The robot arm 820 is disposed in the vicinity of the conveyance path 810, and the first arm portion 822 is rotatably provided. The second arm portion 824 is supported in the distal end portion of the first arm portion 822 so as to be vertically movable in the direction of arrow D in the drawing. The working unit 826 is detachably attached to the distal end portion of the second arm portion 824. For example, the second arm portion 824 may be configured to be extendable and retractable in the direction of arrow E in the drawing.

The working unit 826 can be replaced, depending on a type of work, a type of assembled parts and the like. In the present embodiment, for example, a working unit capable of sucking the power semiconductor module 130 with a suction device 828 and carrying the power semiconductor module 130 is illustrated. For example, the suction device 828 of the working unit 826 may be configured to be able to move up and down in the direction of arrow F in the drawing.

Further, the working unit 826 includes, for example, a sensor camera (not shown) for recognizing the positions of the respective opening portions $124_1$, $124_2$ and $124_3$ of the attachment frame 120 arranged on the mounting surface 110a on the heat radiation device 110.

The robot arm 820 having such a configuration can be controlled with high accuracy, for example, by remote control from a computer (PC) located at a remote place.

Further, the robot arm 820 may be configured to be easily moved by, for example, casters or the like, in response to rearrangement of the automatic assembling apparatus 800, change of the IPM to be assembled, and so forth.

The workbench 830 is disposed movably in the vicinity of the robot arm 820 and the conveyance path 810. A storage case 832 on the workbench 830 has been provided with a plurality of power semiconductor modules 130 to be automatically mounted on the heat radiation device 110 by the robot arm 820. The power semiconductor modules 130 in the storage case 832 may be automatically replenished.

According to the automatic assembling apparatus 800 applicable to the manufacture of the IPM 101 according to the first embodiment, the first and second arm portions 822 and 824 of the robot arm 820 are first moved toward the workbench 830. When the working unit 826 is positioned on the workbench 830, for example, one power semiconductor module 130 is taken out from the storage case 832 by the suction device 828. Then, the power semiconductor module 130 taken out is conveyed to a predetermined mounting position on the conveyance path 810 in accordance with the operation of the robot arm 820.

Meanwhile, a plurality of heat radiation devices 110 is conveyed and moved on the conveyance path 810. When one heat radiation device 110 not yet mounted reaches a predetermined mounting position on the conveyance path 810, for example, at a first timing, the first power semiconductor module 130 is automatically mounted in the first opening portion $124_1$ of the attachment frame 120 by the robot arm 820.

Similarly, when the heat radiation device 110 reaches a predetermined mounting position on the conveyance path 810, for example, at a second timing, the second power semiconductor module 130 is automatically mounted in the second opening portion $124_2$ of the attachment frame 120. For example, at a third timing, the third power semiconductor module 130 is automatically mounted in the third opening portion $124_3$ of the attachment frame 120.

In this way, the mounting of the power semiconductor module 130 is performed automatically for the respective opening portions $124_1$, $124_2$ and $124_3$ based on the attachment frame 120 by using the robot arm 820.

The timing and order of mounting the power semiconductor module 130 are not limited to the aforementioned ones. For example, the mounting may be performed while the conveyance of the heat radiation device 110 is stopped.

The heat radiation device 110 on which three power semiconductor modules 130 are all mounted in this manner is further conveyed on the conveyance path 810 and is sent to the next process, for example, a process of mounting the heat insulating sheet 150.

In the assembling process of the IPM 101 according to the first embodiment, at least, the mounting of the power semiconductor module 130 on the heat radiation device 110 is automated, thereby enabling mass production and cost reduction.

The automation of assembling is not limited to the process of mounting the power semiconductor module 130 but may be applied to, for example, one or more of a process of forming the thermally conductive resin layer 210T on the mounting surface 110a of the heat radiation device 110, a process of disposing the attachment frame 120 on the mounting surface 110a, a process of disposing the heat insulating sheet 150 on the package 132 of the power semiconductor module 130, a process of disposing the presser plate 160S on the heat insulating sheet 150, a process of disposing the heat radiation sheet 170 on the presser plate 160S, and a process of mounting the drive circuit part 180 on the heat radiation sheet 170. The automation of assembling may also be applied to a process of attaching the fixtures 190 and 192.

That is, the method of assembling the IPM 101 according to the first embodiment includes performing at least one of the respective processes using the automatic assembling apparatus 800.

In addition, the automatic assembling apparatus 800 includes the robot arm 820. Among the respective processes, at least, the process of mounting the power semiconductor module 130 based on the attachment frame 120 is performed using the robot arm 820.

With the configuration described above, it is possible to make sure that the IPM 101 according to the first embodiment is excellent in heat radiation characteristics, easy to modularize, and suitable for miniaturization.

According to the IPM 101 of the first embodiment, the power semiconductor module 130 is mounted on the heat radiation device 110 having a structure of a water-cooled cooler so that it is possible to obtain excellent heat radiation characteristics.

Further, by disposing the presser plate 160S having a spring property on the power semiconductor module 130, even when the thermally conductive resin layer 210T is used for joining the power semiconductor module 130, it is possible to prevent the positional deviation of the power semiconductor module 130 and to improve the decrease in the yield of the IPM 101.

In addition, by disposing the attachment frame 120 on the mounting surface 110a of the heat radiation device 110, it is possible to increase the mounting accuracy of the power semiconductor module 130 and to improve the reliability of the IPM 101.

Moreover, since the attachment frame 120 disposed on the mounting surface 110a of the heat radiation device 110 is used as a guide when mounting the power semiconductor module 130, the mounting of the power semiconductor module 130 can be automated so that it is possible to improve the productivity of the IPM 101 through mass production and cost reduction.

Further, when the IPM according to the first embodiment is to be mounted on, for example, a motor vehicle, it becomes possible to develop a highly efficient system while securing even higher safety as well as higher performance and higher functionality.

Second Embodiment

An IPM 201 according to a second embodiment has substantially the same structure as the IPM 101 according to the first embodiment (see FIG. 1). Specifically, in the IPM 201 according to the second embodiment, a solder layer 210S including a solder as a joining member is used, and the presser plate 160S is replaced with a heat radiation plate 160A. In other respects, the IPM 201 according to the second embodiment has the same structure as the IPM 101 according to the first embodiment. Thus, the same parts are designated by the same reference numerals, and detailed description thereof will be omitted.

The schematic exploded bird's eye view configuration of the IPM 201 according to the second embodiment is represented as shown in FIGS. 9A to 9G.

The IPM 201 according to the second embodiment includes a joining member 210S configured to join each power semiconductor module $130_n$ on the mounting surface 110a of the heat radiation device 110. The joining member 210S includes a solder configured to fix each power semiconductor module $130_n$ on the mounting surface 110a.

Further, a heat radiation plate 160A formed of a thin metal plate having a heat radiation property, which is configured to radiate heat generated from each power semiconductor module $130_n$ fixed by the solder layer 210S, and a heat radiation sheet 170, are further provided on the heat insulating sheet 150 between the heat insulating sheet 150 and the drive circuit part 180.

A method of assembling the IPM 201 according to the second embodiment when manufacturing the same will now be described with reference to FIGS. 9A to 9G.

Figure 9:
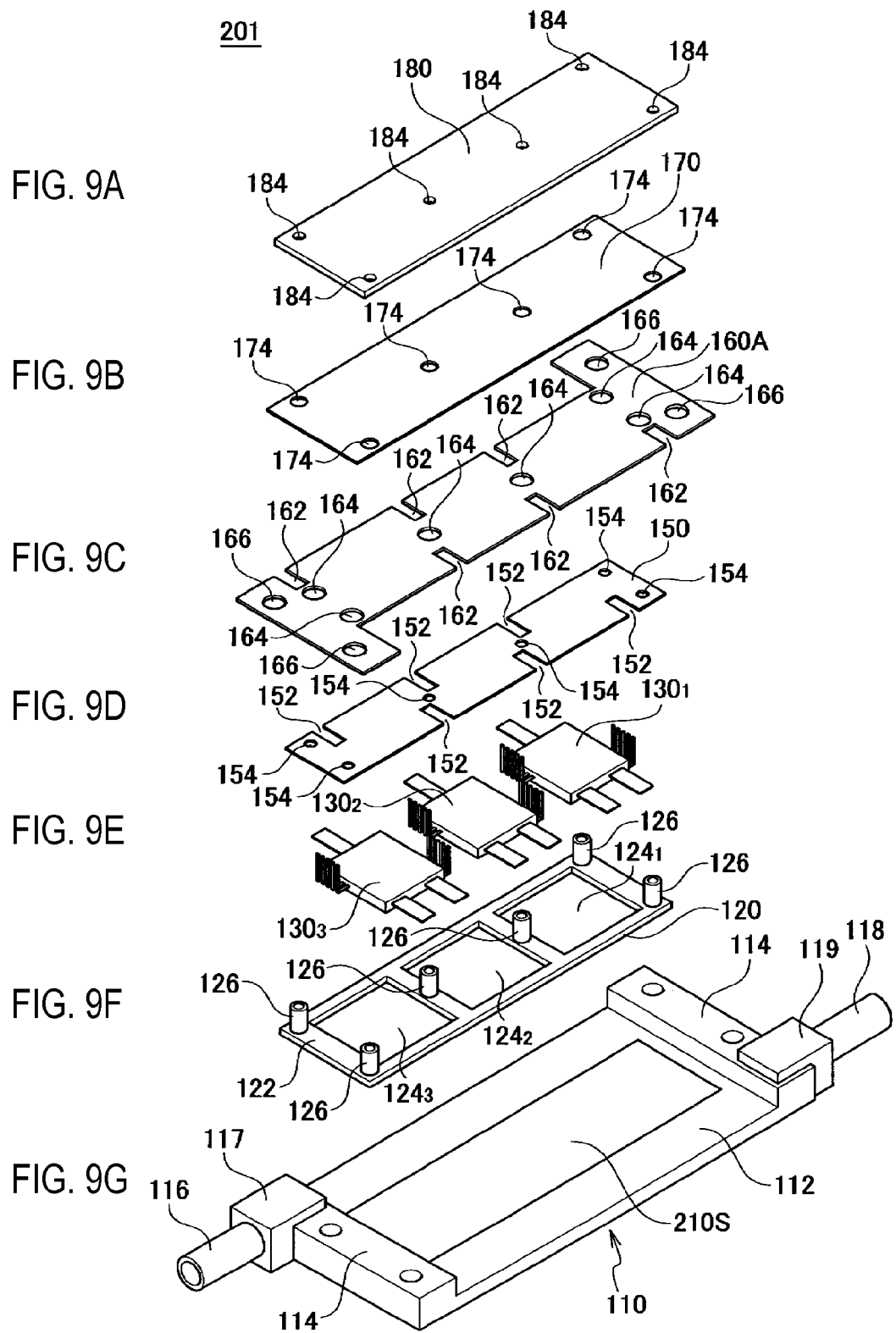
FIGS. 9A to 9G are schematic exploded configuration views of an intelligent power module according to a second embodiment.

First, as shown in FIG. 9G, the heat radiation device 110 in which the solder layer 210S has been formed on the mounting surface 110a of the heat radiation portion 112 is prepared.

Similarly to the case of the IPM 101 according to the first embodiment, the respective processes of disposing the attachment frame 120 (FIG. 9F), joining the power semiconductor module 130 (FIG. 9E), and mounting the heat insulating sheet 150 (FIG. 9D) are performed. Thereafter, as shown in FIG. 9C, the heat radiation plate 160A is mounted and fixed on the heat insulating sheet 150.

In this case, since the solder layer 210S is provided on the mounting surface 110a of the heat radiation device 110 and the power semiconductor module 130 is joined with the solder layer 210S, it is possible to fix the position of each power semiconductor module $130_n$ as mounted. Therefore, it is not necessary to use the presser plate 160S having a spring property. Instead, the heat radiation plate 160A, which is formed of a thin plate of metal having a high heat radiation property, such as Al or the like, is disposed on the heat insulating sheet 150.

Thereafter, as in the case of the IPM 101 according to the first embodiment, the respective processes of mounting the heat radiation sheet 170 (FIG. 9B) and mounting the drive circuit part 180 (FIG. 9A) are performed to complete the IPM 201 according to the second embodiment.

That is, the method of assembling the IPM 201 according to the second embodiment includes a process of disposing the attachment frame 120 on the mounting surface 110a of the heat radiation device 110, a process of mounting the power semiconductor module 130, which seals semiconductor devices, based on the attachment frame 120, and a process of mounting the drive circuit part 180 for driving the power semiconductor module 130, on the power semiconductor module 130 via the heat insulating sheet 150.

The method of assembling the IPM 201 according to the second embodiment further includes a process of forming the solder layer 210S for fixing the power semiconductor module 130 on the mounting surface 110a, a process of disposing the heat radiation plate 160A for radiating the heat generated from the power semiconductor module 130 fixed by the solder layer 210S on the heat insulating sheet 150, and a process of disposing the heat radiation sheet 170 on the heat radiation plate 160A.

As such, as in the case of the IPM 101, the IPM 201 of the second embodiment is also excellent in heat radiation characteristics, easy to modularize, and suitable for miniaturization.

Further, similarly to the IPM 101, with the IPM 201, it is possible to improve reliability and productivity.

Further, in the manufacturing process of the IPM 201, at least, the mounting of the power semiconductor module 130 on the heat radiation device 110 is automated by the automatic assembling apparatus 800 (see FIG. 8) including the robot arm 820 and the like, thereby enabling mass production and cost reduction.

That is, the method of assembling the IPM 201 according to the second embodiment includes performing at least one of the respective processes using the automatic assembling apparatus 800.

In addition, the automatic assembling apparatus 800 includes the robot arm 820. Among the respective processes, at least the process of mounting the power semiconductor module 130 based on the attachment frame 120 is performed using the robot arm 820.

In the IPM 201 according to the second embodiment, the heat radiation plate 160A and the heat radiation sheet 170 may be omitted because they are not indispensable configuration requirements.

The IPM 201 according to the second embodiment includes the heat radiation device 110, the attachment frame 120 disposed on the mounting surface 110a of the heat radiation device 110, the power semiconductor module 130 (each power semiconductor module $130_n$) mounted on the basis of the attachment frame 120 and configured to seal semiconductor devices, and the drive circuit part 180 mounted on the power semiconductor module 130 via the heat insulating sheet 150 and configured to drive the power semiconductor module 130.

Further, when the IPM according to the second embodiment is to be mounted on, for example, a motor vehicle, it becomes possible to develop a highly efficient system while securing even higher safety as well as higher performance and higher functionality.

Third Embodiment (Schematic Configuration of Intelligent Power Module)

Figure 10:
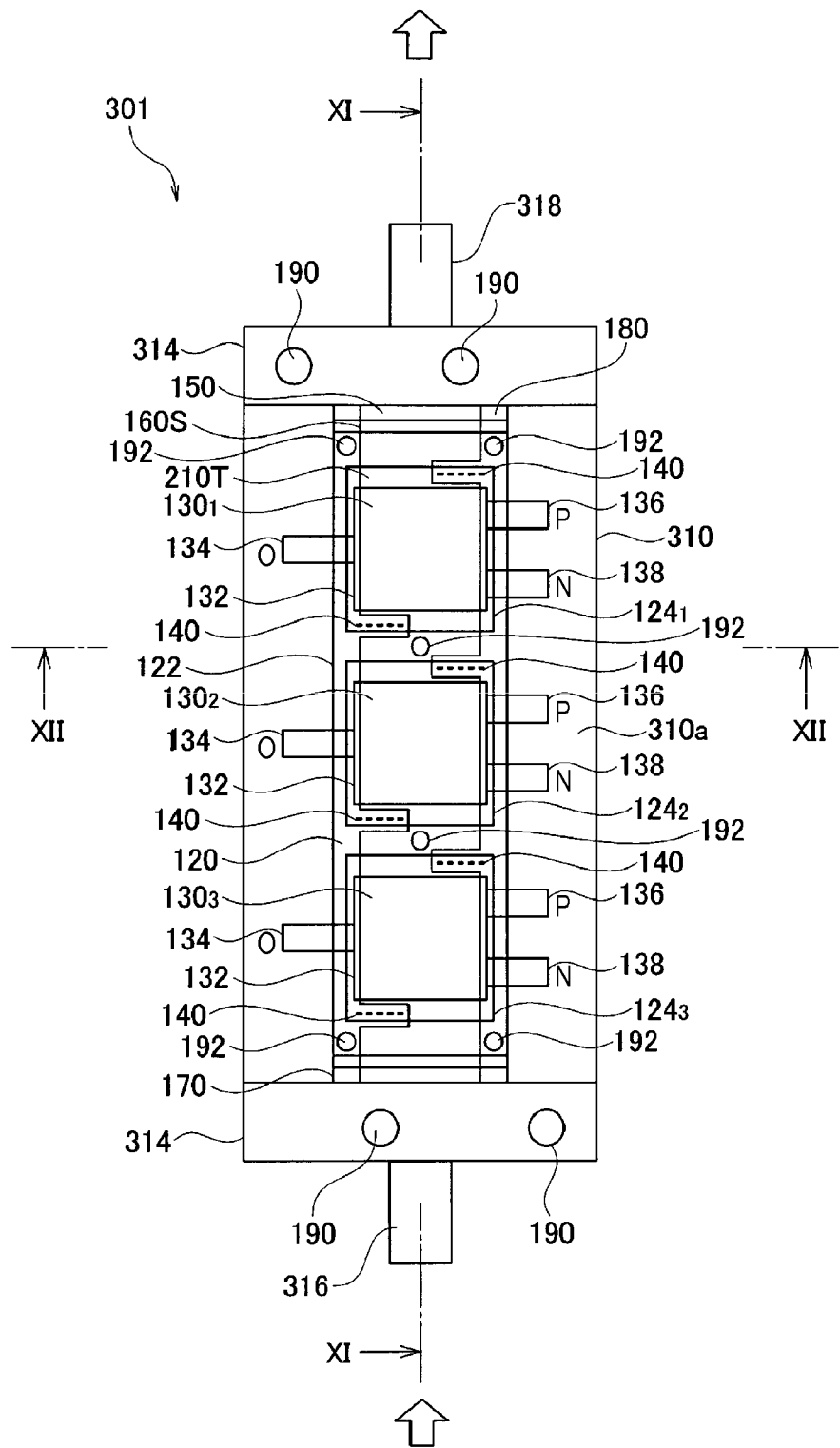
FIG. 10 is a plan view showing a schematic configuration of an intelligent power module according to a third embodiment.

The planar structure of an IPM 301 according to a third embodiment is represented as shown in FIG. 10. In FIG. 10, a part of the drive circuit part 180 and the like are penetratively shown.

Figure 11:
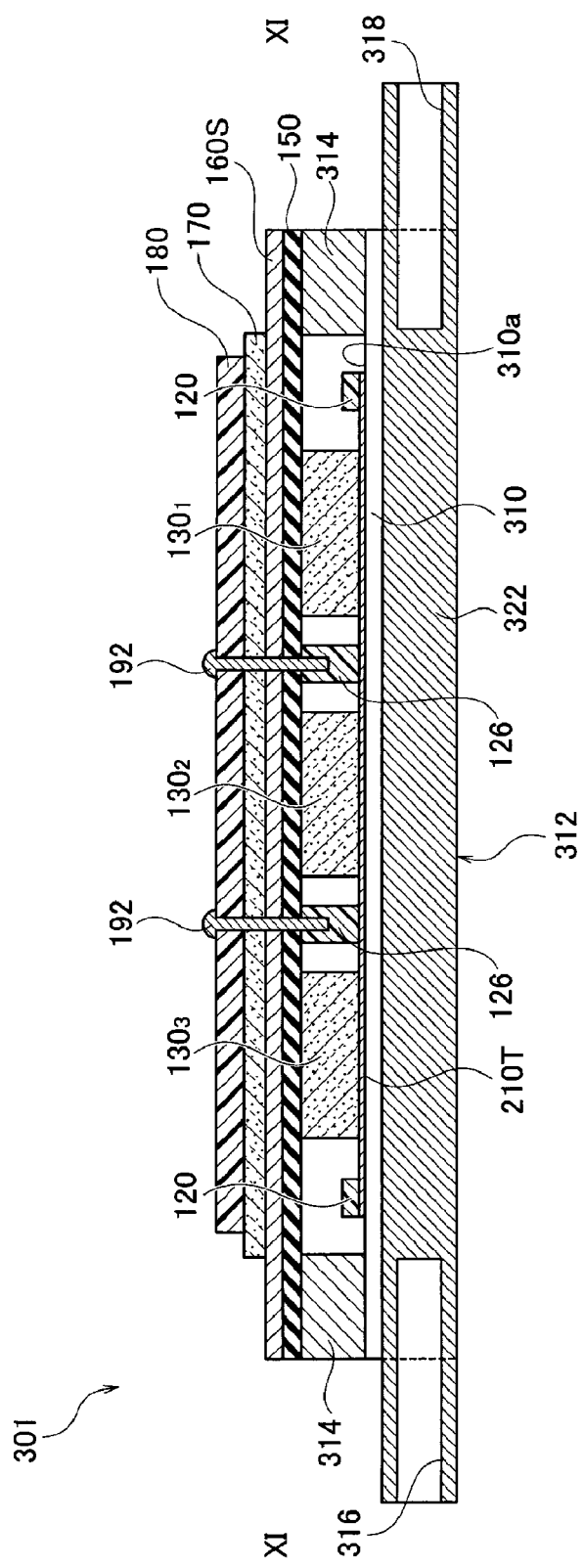
FIG. 11 is a view showing main parts of the configuration of the intelligent power module according to the third embodiment and is a schematic sectional structural view taken along line XI-XI in FIG. 10.
Figure 12:
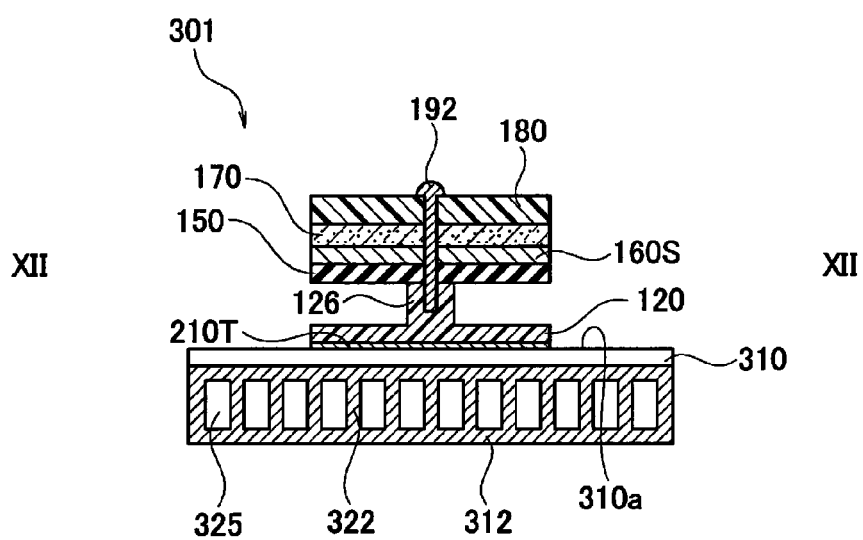
FIG. 12 is a view showing main parts of the configuration of the intelligent power module according to the third embodiment and is a schematic sectional structural view taken along line XII-XII in FIG. 10.

Further, the sectional structure taken along line XI-XI in FIG. 10 is represented as shown in FIG. 11. The sectional structure taken along line XII-XII in FIG. 10 is represented as shown in FIG. 12. In addition, the schematic exploded bird's eye view configuration of the IPM 301 according to the third embodiment is represented as shown in FIGS. 13A to 13G.

In the IPM 301 according to the third embodiment, the same parts as those of the IPM 101 according to the first embodiment are designated by the same reference numerals, and a detailed description thereof will be omitted (see FIG. 1). Specifically, as shown in FIGS. 13A and 13G, the IPM 301 according to the third embodiment includes as a heat radiation device, a heat radiation plate (for example, a heat radiation plate (cooling plate) such as a heat sink made of Al or the like) 310 and a cooler 312 such as a water jacket (WJ) or the like attached to the heat radiation plate 310. In other respects, the IPM 301 according to the third embodiment has substantially the same structure as the IPM 101 according to the first embodiment.

That is, the IPM 301 according to the third embodiment includes a heat radiation device (the heat radiation plate 310 and the cooler 312), an attachment frame 120 disposed on a mounting surface 310a of the heat radiation plate 310, a power semiconductor module 130 (each power semiconductor module $130_n$) mounted on the basis of the attachment frame 120 and configured to seal semiconductor devices, and a drive circuit part 180 mounted on the power semiconductor module 130 via a heat insulating sheet 150 and configured to drive the power semiconductor module 130.

As shown in FIGS. 10 to 12, the cooler 312 capable of being mounted on a non-mounting surface (back surface) of the heat radiation plate 310 includes a plurality of cooling passages 325 formed therein and partitioned by a plurality of cooling walls 322. The cooling passages 325 are arranged in parallel along the longitudinal direction of the cooler 312. The cooler 312 cools each power semiconductor module $130_n$ as cooling water passes through the cooling passages 325. The cooler 312 is provided at one end with an introduction port 316 for introducing the cooling water into the cooling passages 325 and at the other end with a discharge port 318 for discharging the cooling water passed through the cooling passages 325.

On both ends 314 of the heat radiation plate 310 in one direction, there are provided fixing portions 320 for respectively fixing a heat insulating sheet 150 and a presser plate 160S by fixtures 190 such as screws or the likes. A mounting surface 310a for mounting each power semiconductor module $130_n$ is provided between both end portions 314. A thermally conductive resin layer (joining member) 210T is provided on the mounting surface 310a.

That is, the IPM 301 according to the third embodiment includes a joining member 210T for joining each power semiconductor module $130_n$ on the mounting surface 310a of the heat radiation plate 310. The joining member 210T includes a thermally conductive resin for holding each power semiconductor module $130_n$ on the mounting surface 310a of the heat radiation plate 310.

A presser plate 160S formed of a thin metal plate having a spring property and configured to restrict movement of each power semiconductor module $130_n$ held by the thermally conductive resin layer 210T, and a heat radiation sheet 170, are provided on the heat insulating sheet 150 between the heat insulating sheet 150 and the drive circuit part 180.

The method of assembling the IPM 301 according to the third embodiment includes a process of disposing the attachment frame 120 on the mounting surface 310a of the heat radiation plate 310, a process of mounting the power semiconductor module 130, which seals semiconductor devices, based on the attachment frame 120, and a process of mounting the drive circuit part 180 for driving the power semiconductor module 130, on the power semiconductor module 130 via the heat insulating sheet 150.

The method of assembling the IPM 301 according to the third embodiment further includes a process of forming the thermally conductive resin layer 210T for holding the power semiconductor module 130 on the mounting surface 310a, a process of disposing the presser plate 160S for restricting movement of the power semiconductor module 130 held by the thermally conductive resin layer 210T,Y on the heat insulating sheet 150, and a process of disposing the heat radiation sheet 170 on the presser plate 160S.

As such, as in the case of the IPM 101, the IPM 301 according to the third embodiment is also excellent in heat radiation characteristics, easy to modularize, and suitable for miniaturization.

Further, similarly to the IPM 101, with the IPM 301, it is possible to improve reliability and productivity.

Moreover, in the assembling process of the IPM 301, at least, the mounting of the power semiconductor module 130 on the heat radiation plate 310 is automated by the automatic assembling apparatus 800 (see FIG. 8) including the robot arm 820 and the like, thereby enabling mass production and cost reduction.

That is, the method of assembling the IPM 301 according to the third embodiment includes performing at least one of the respective processes using the automatic assembling apparatus 800.

In addition, the automatic assembling apparatus 800 includes the robot arm 820. Among the respective processes, at least the process of mounting the power semiconductor module 130 based on the attachment frame 120 is performed using the robot arm 820.

Not only the features of the IPM 101 according to the first embodiment but also the features of the IPM 201 according to the second embodiment may be applied to the IPM 301 according to the third embodiment. That is, the IPM 301 may be configured to fix the power semiconductor module 130 to the mounting surface 310a of the heat radiation plate 310 by a solder layer (joining member) 210S, without the heat radiation plate 160A and the heat radiation sheet 170.

Further, when the IPM according to the third embodiment is to be mounted on, for example, a motor vehicle, it becomes possible to develop a highly efficient system while securing even higher safety as well as higher performance and higher functionality.

[Modification of Third Embodiment]
(Schematic Configuration of Intelligent Power Module)

Figure 14:
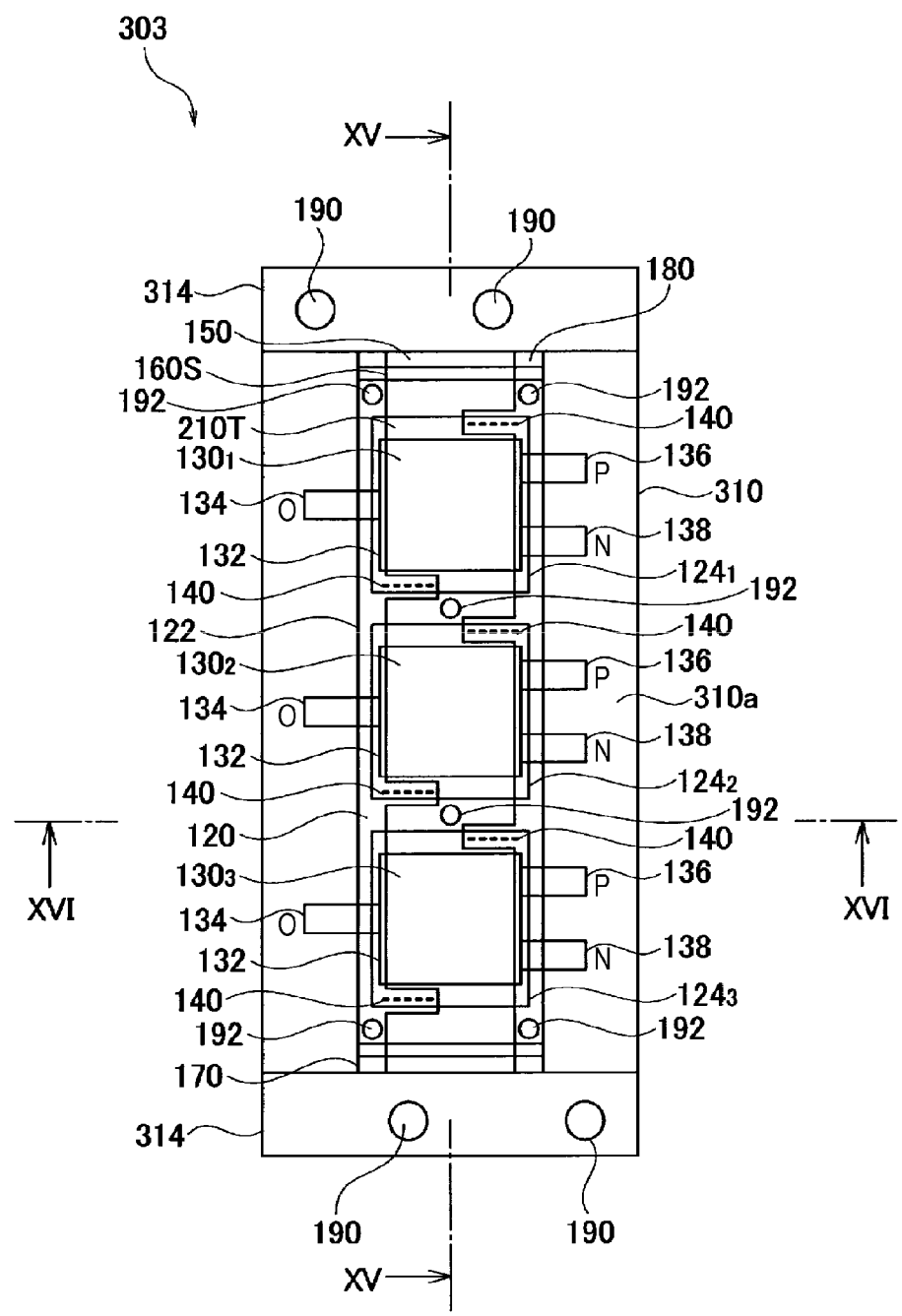
FIG. 14 is a plan view showing a schematic configuration of an intelligent power module according to a modification of the third embodiment.

The planar structure of an IPM 303 according to a modification of the third embodiment is represented as shown in FIG. 14. In FIG. 14, a part of the drive circuit part 180 and the like are penetratively shown.

Figure 15:
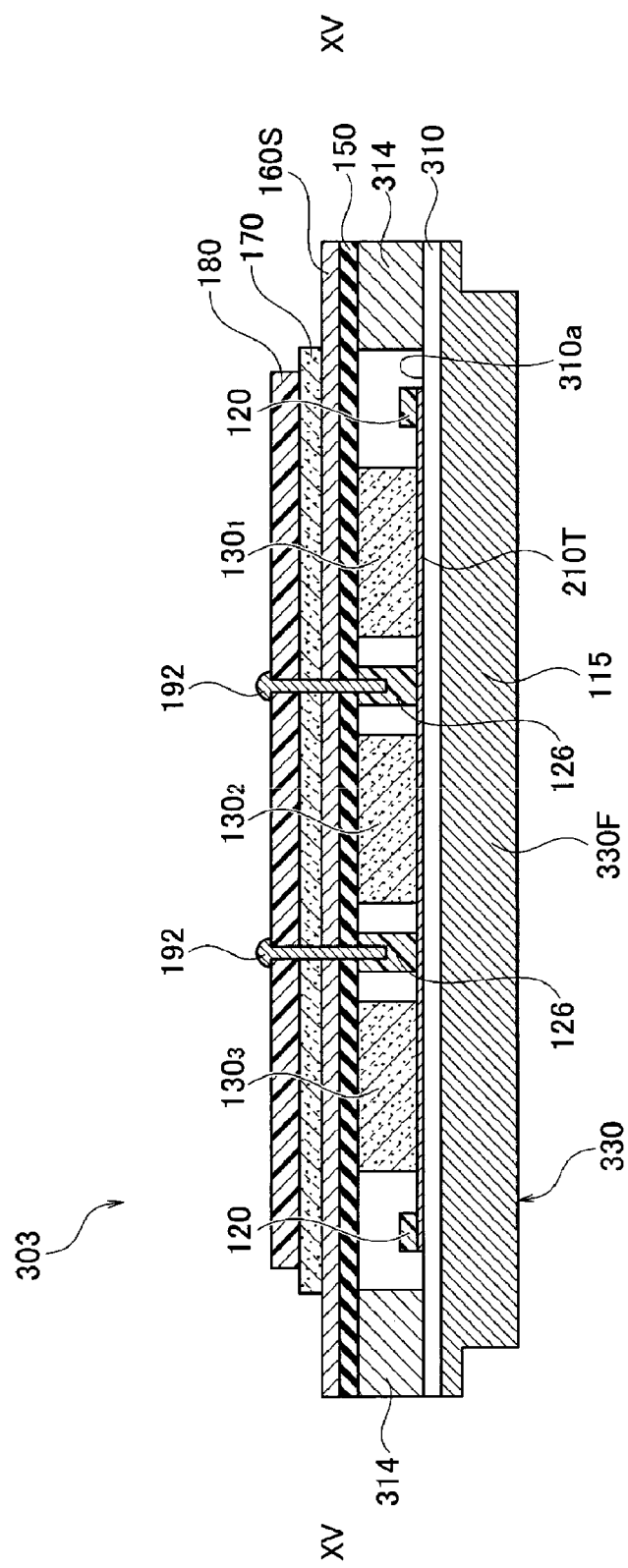
FIG. 15 is a view showing main parts of the configuration of the intelligent power module according to the modification of the third embodiment and is a schematic sectional structural view taken along line XV-XV in FIG. 14.
Figure 16:
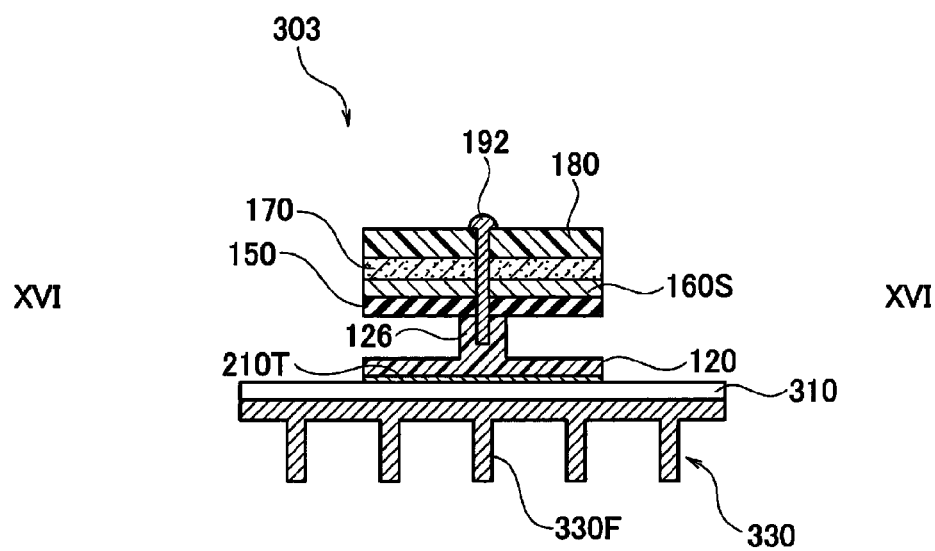
FIG. 16 is a view showing main parts of the configuration of the intelligent power module according to the modification of the third embodiment and is a schematic sectional structural view taken along line XVI-XVI in FIG. 14.

Further, the sectional structure taken along line XV-XV in FIG. 14 is represented as shown in FIG. 15. The sectional structure taken along line XVI-XVI in FIG. 14 is represented as shown in FIG. 16. In addition, the schematic exploded bird's eye view configuration of the IPM 303 according to the modification of the third embodiment is represented as shown in FIGS. 17A to 17G.

In the IPM 303 according to the modification of the third embodiment, the same parts as those of the IPM 301 according to the third embodiment are designated by the same reference numerals, and a detailed description thereof will be omitted (see FIG. 10). Specifically, as shown in FIG. 17G, the IPM 303 according to the modification of the third embodiment includes, as a heat radiation device, a heat radiation plate (for example, a heat radiation plate (cooling plate) such as a heat sink made of Al or the like) 310 and a radiator 330 attached to the heat radiation plate 310. In other respects, the IPM 303 according to the modification of the third embodiment has substantially the same structure as the IPM 301 according to the third embodiment.

As shown in FIGS. 14 to 16, the radiator 330 capable of being mounted on the non-mounting surface (back surface) of the heat radiation plate 310 includes a plurality of cooling fins (heat radiation fins or flat fins) 330F.

That is, the IPM 303 according to the modification of the third embodiment includes a heat radiation device (the heat radiation plate 310 and the radiator 330), an attachment frame 120 disposed on the mounting surface 310a of the heat radiation plate 310, a power semiconductor module 130 (each power semiconductor module 130$_n$) mounted on the basis of the attachment frame 120 and configured to seal semiconductor devices, and a drive circuit part 180 mounted on the power semiconductor module 130 via a heat insulating sheet 150 and configured to drive the power semiconductor module 130.

The IPM 303 according to the modification of the third embodiment includes a joining member 210T for joining each power semiconductor module 130$_n$ to the mounting surface 310a of the heat radiation plate 310. The joining member 210T includes a thermally conductive resin for holding each power semiconductor module 130$_n$ on the mounting surface 310a of the heat radiation plate 310.

A presser plate 160S formed of a thin metal plate having a spring property and configured to restrict movement of each power semiconductor module 130$_n$ held by a thermally conductive resin layer 210T, and a heat radiation sheet 170, are further provided on the heat insulating sheet 150 between the heat insulating sheet 150 and the drive circuit part 180.

The method of assembling the IPM 303 according to the modification of the third embodiment includes a process of disposing the attachment frame 120 on the mounting surface 310a of the heat radiation plate 310, a process of mounting the power semiconductor module 130, which seals semiconductor devices, based on the attachment frame 120, and a process of mounting the drive circuit part 180 for driving the power semiconductor module 130, on the power semiconductor module 130 via the heat insulating sheet 150.

The method of assembling the IPM 303 according to the modification of the third embodiment further includes a process of forming the thermally conductive resin layer 210T for holding the power semiconductor module 130 on the mounting surface 310a, a process of disposing the presser plate 160S for restricting movement of the power semiconductor module 130 held by the thermally conductive resin layer 210T on the heat insulating sheet 150, and a process of disposing the heat radiation sheet 170 on the presser plate 160S.

As such, as in the case of the IPM 301, the IPM 303 according to the modification of the third embodiment is also excellent in heat radiation characteristics, easy to modularize, and suitable for miniaturization.

Further, similarly to the IPM 301, with the IPM 303, it is possible to improve reliability and productivity.

Moreover, in the manufacturing process of the IPM 303, at least, the mounting of the power semiconductor module 130 on the heat radiation plate 310 is automated by the automatic assembling apparatus 800 (see FIG. 8) including the robot arm 820 and the like, thereby enabling mass production and cost reduction.

That is, the method of assembling the IPM 303 according to the modification of the third embodiment includes performing at least one of the respective processes using the automatic assembling apparatus 800.

In addition, the automatic assembling apparatus 800 includes the robot arm 820. Among the respective processes, at least the process of mounting the power semiconductor module 130 based on the attachment frame 120 is performed using the robot arm 820.

Figure 18:
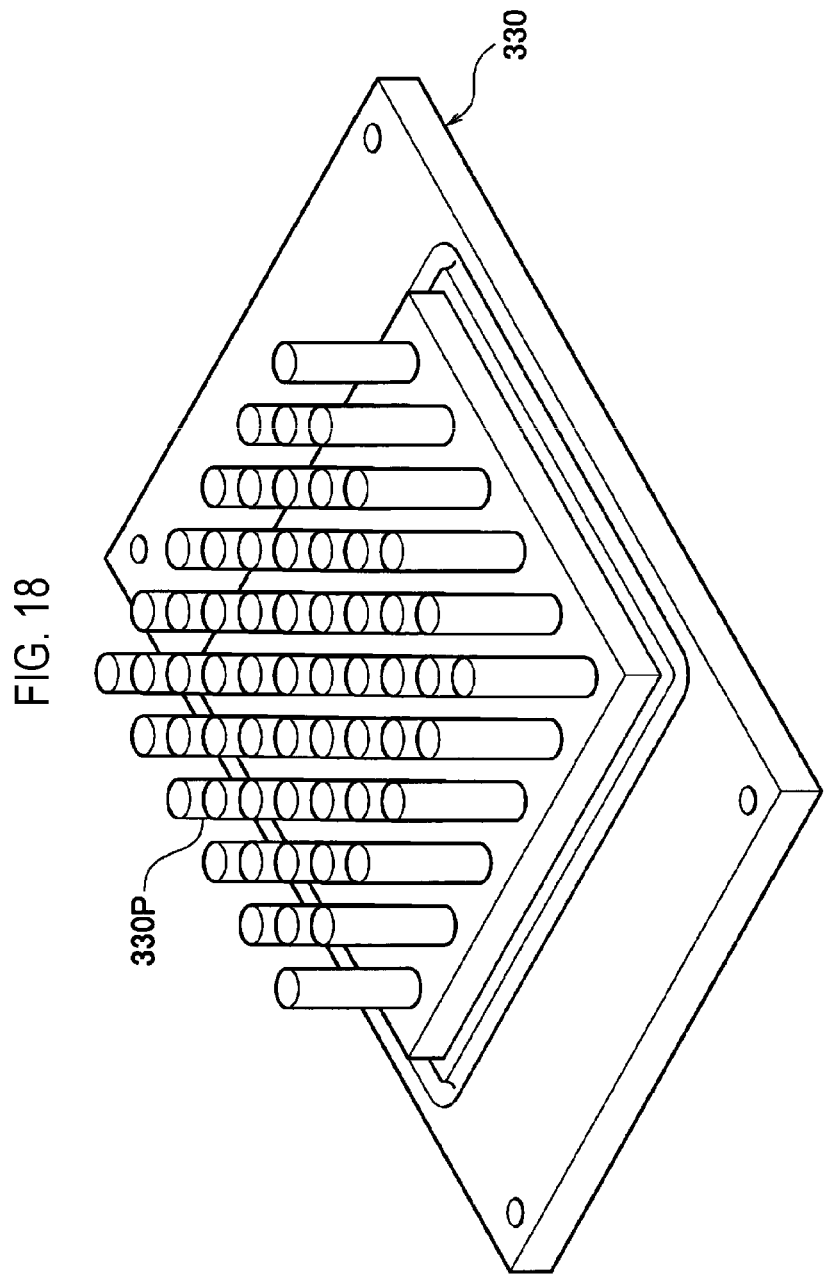
FIG. 18 is a bird's-eye view showing another configuration example of the radiator applicable to the intelligent power module according to the modification of the third embodiment.

In the IPM 303 according to the modification of the third embodiment, the radiator 330 is not limited to the cooling fins, but may include, for example, a plurality of cooling pins (heat radiation pins) 330P as shown in FIG. 18.

Of course, the IPM 303 may be configured to fix the power semiconductor module 130 to the mounting surface 310a of the heat radiation plate 310 by a solder layer (joining member) 210S, without the heat radiation plate 160A and the heat radiation sheet 170.

Further, when the IPM according to the modification of the third embodiment is to be mounted on, for example, a motor vehicle, it becomes possible to develop a highly efficient system while securing even higher safety as well as higher performance and higher functionality.

Application Example 1

Next, an application example of the IPM 101 according to the first embodiment will be described.

Figure 19:
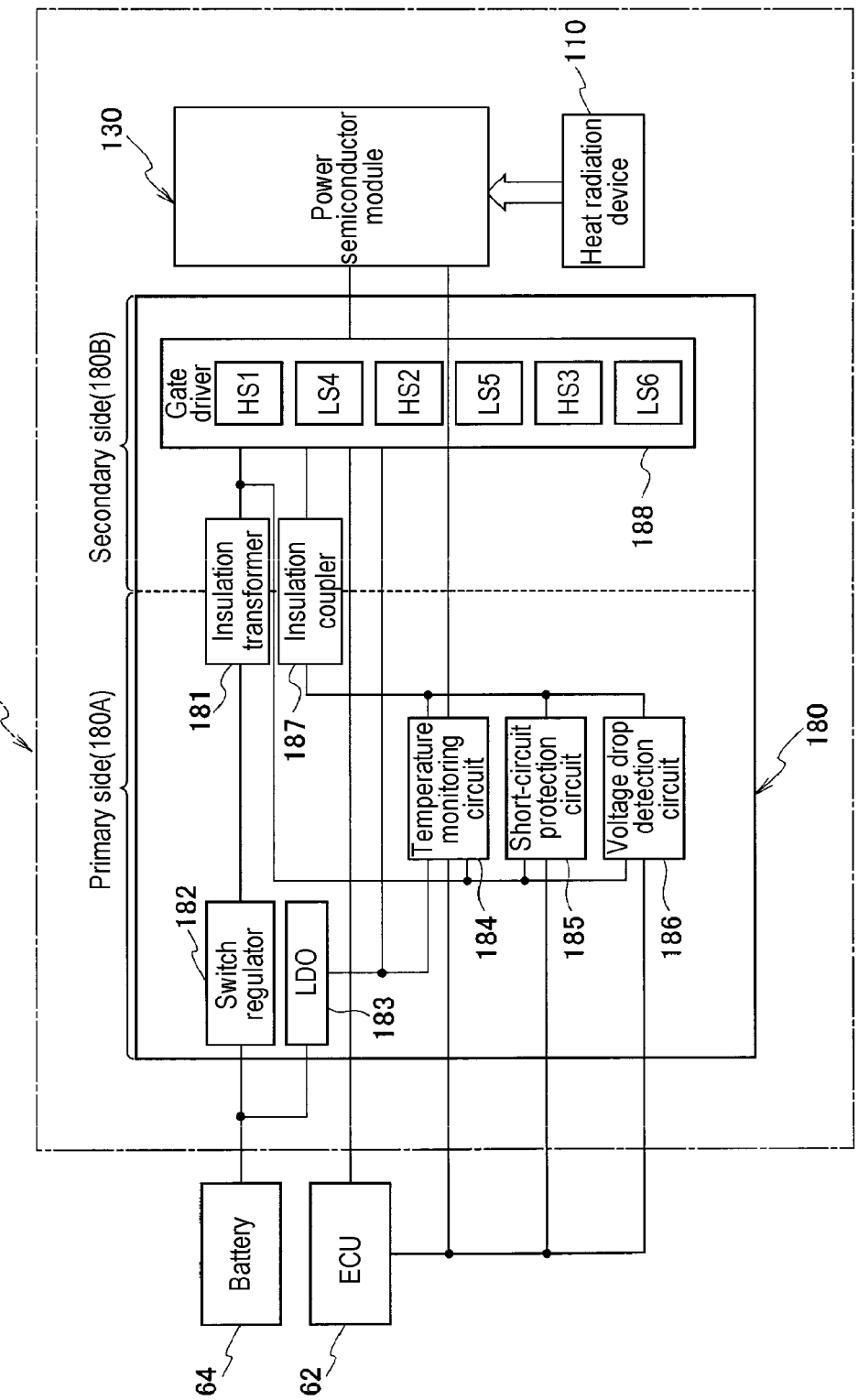
FIG. 19 is a block diagram showing a configuration example of a drive circuit part applicable to the intelligent power module in a power control unit of an electric vehicle or a hybrid vehicle equipped with the intelligent power module according to the first embodiment.

FIG. 19 illustrates a case in which the IPM 101 according to the first embodiment is mounted on, for example, a power control unit of an electric vehicle or a hybrid vehicle. The drive circuit part 180 includes a primary side circuit part 180A and a secondary side circuit part 180B.

Primary coils (L1) of insulation transformers 181 (181$_1$, 181$_2$, 181$_3$, 181$_4$, 181$_5$ and 181$_6$), a switch regulator 182, an LDO (Low Drop Out) 183, a temperature monitoring circuit 184, a short-circuit protection circuit 185, a voltage drop detection circuit 186, and a light-receiving portion side of insulation couplers (photo couplers) 187 (187$_1$, 187$_2$, 187$_3$, 187$_4$, 187$_5$ and 187$_6$) are provided in the primary side circuit part 180A. The primary coils (L1) of the insulation transformers 181 are commonly connected to the switch regulator 182. The switch regulator 182 and the LDO 183 are connected to, for example, a battery 64 of the electric vehicle or the hybrid vehicle. The temperature monitoring circuit 184, the short-circuit protection circuit 185 and the voltage drop detection circuit 186 are commonly connected to the light-receiving portion side of the insulation couplers 187.

Secondary coils (L2) of the insulation transformers 181, a gate driver 188 and a light-emitting portion side of the insulation couplers 187 are provided in the secondary side circuit part 180B. The secondary coils (L2) of the insulation transformers 181 are commonly connected to the gate driver 188, the temperature monitoring circuit 184, the short-circuit protection circuit 185 and the voltage drop detection circuit 186. The gate driver 188 is connected to the light-emitting portion side of the insulation couplers 187.

The gate driver 188 and the temperature monitoring circuit 184 are connected between the LDO 183 and the power semiconductor module 130 (each power semiconductor module 130$_n$). The gate driver 188, the temperature monitoring circuit 184, the short-circuit protection circuit 185 and the voltage drop detection circuit 186 are connected to an ECU (Engine Control Unit) 62 of the electric vehicle or the hybrid vehicle.

The gate driver 188 includes a plurality of high-voltage side drive circuits HS1, HS2 and HS3 and a plurality of low-voltage side drive circuits LS4, LS5 and LS6. Positive or negative power is supplied to the gate driver 188 from a power supply circuit to be described later.

Figure 20B:
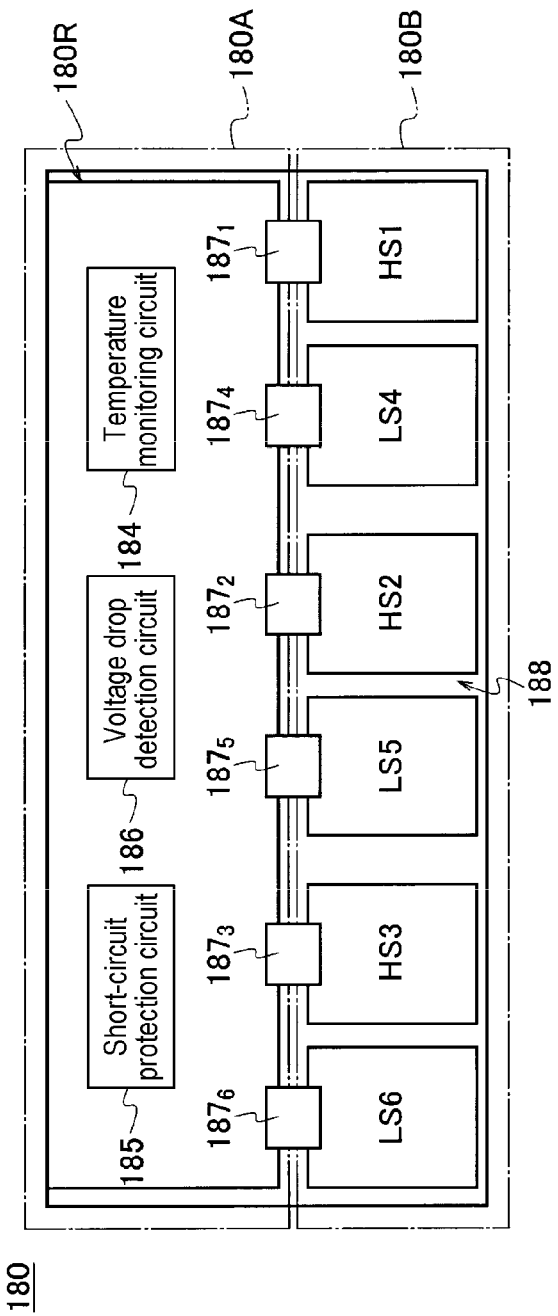

The planar pattern configuration (substrate configuration) of the drive circuit part 180 having the configuration described above is represented in FIGS. 20A and 20B. FIG. 20A is a schematic view showing the planar pattern configuration of a front side (upper surface) 180S of the drive circuit part 180. FIG. 20B is a schematic view showing the planar pattern configuration of a back side (lower surface)

180R when it is seen penetratively through the planar pattern configuration of the front side 180S.

For example, the drive circuit part 180, which is applicable to the IPM 101 according to the first embodiment, is commonly provided on each of a plurality of power semiconductor modules $130_n$. The drive circuit part 180 has a rectangular shape and includes the primary side circuit part 180A arranged along the longitudinal direction and the secondary side circuit part 180B arranged adjacent to the primary side circuit part 180A.

A power supply circuit including the switch regulator 182 and the LDO 183 described above is configured on the front side 180S of the primary side circuit part 180A. The temperature monitoring circuit 184, the short-circuit protection circuit 185, the voltage drop detection circuit 186 and the like are arranged on the back side 180R.

The plurality of high-voltage side drive circuits HS1, HS2 and HS3 and the plurality of low-voltage side drive circuits LS4, LS5 and LS6 of the gate driver 188 are alternately arranged in the secondary side circuit part 180B.

The respective drive circuits HS1, HS2, HS3, LS4, LS5 and LS6 of the secondary side circuit part 180B are commonly connected to the power supply circuit on the front side 180S of the primary side circuit part 180A respectively via the insulation transformers $181_1$ to $181_6$ arranged across the primary side circuit part 180A and the secondary side circuit part 180B. In addition, the respective drive circuits HS1, HS2, HS3, LS4, LS5 and LS6 are commonly connected to the temperature monitoring circuit 184, the short-circuit protection circuit 185 and the voltage drop detection circuit 186 on the back side 180R of the primary side circuit part 180A respectively via the insulation couplers $187_1$ to $187_6$ arranged across the primary side circuit part 180A and the secondary side circuit part 180B.

Description will now be made on a schematic configuration of a three-phase AC inverter 101A for driving, for example, a three-phase AC motor part (not shown) of an electric vehicle or a hybrid vehicle, which is configured by applying the IPM 101 according to the first embodiment. The three-phase AC inverter 101A is an example in which a SiC MOSFET (Silicon Carbide Metal Oxide Semiconductor Field Effect Transistor) is applied to semiconductor devices Q1 to Q6.

Figure 21:
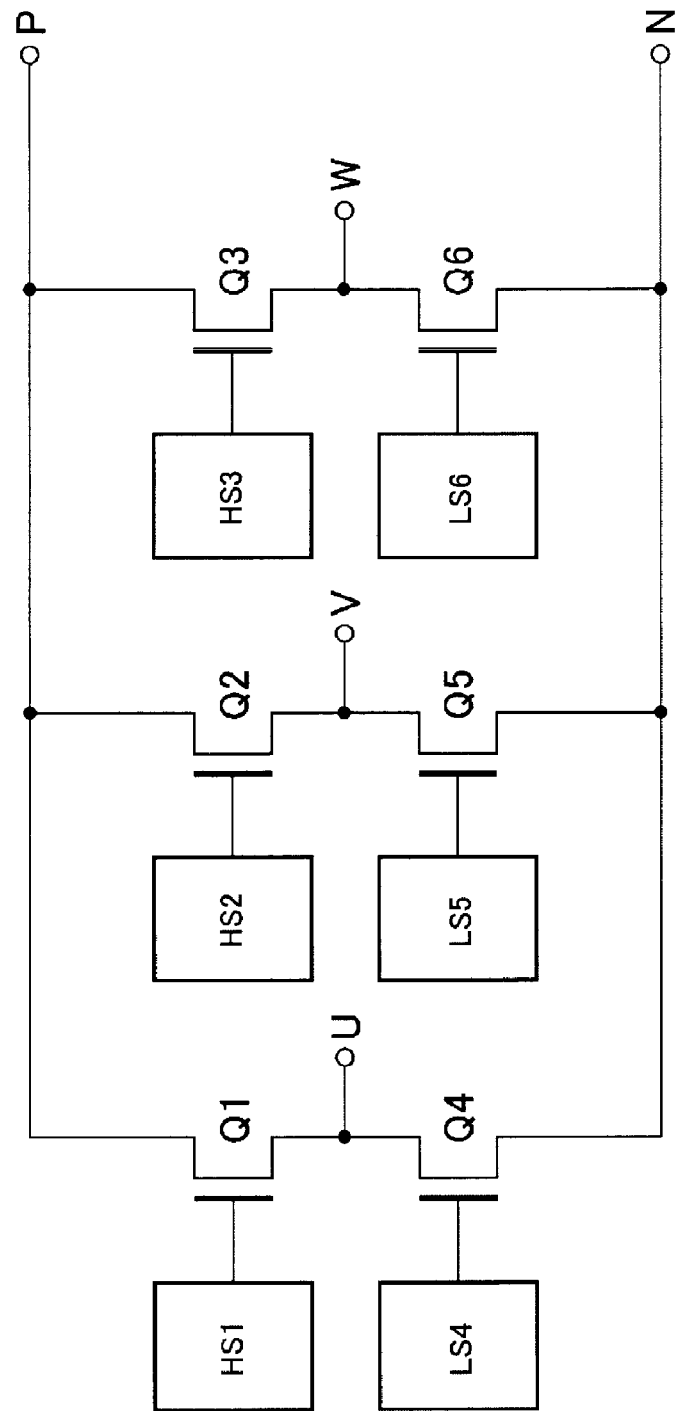
FIG. 21 is a schematic configuration view of a three-phase AC inverter configured using the intelligent power module according to the first embodiment.

As shown in FIG. 21, the three-phase AC inverter 101A includes U-phase inverters (SiC MOSFETs Q1 and Q4), V-phase inverters (SiC MOSFETs Q2 and Q5) and W-phase inverters (SiC MOSFETs Q3 and Q6) which are respectively connected to corresponding U, V and W phases of the three-phase AC motor part.

The high-voltage side drive circuit HS1 is connected to the SiC MOSFET Q1 of the U-phase inverter, and the low-voltage side drive circuit LS4 is connected to the SiC MOSFET Q4 of the U-phase inverter. Similarly, the high-voltage side drive circuit HS2 is connected to the SiC MOSFET Q2 of the V-phase inverter, and the low-voltage side drive circuit LS5 is connected to the SiC MOSFET Q5 of the V-phase inverter. Similarly, the high-voltage side drive circuit HS3 is connected to the SiC MOSFET Q3 of the W-phase inverter, and the low-voltage side drive circuit LS6 is connected to the SiC MOSFET Q6 of the W-phase inverter.

Figure 22:
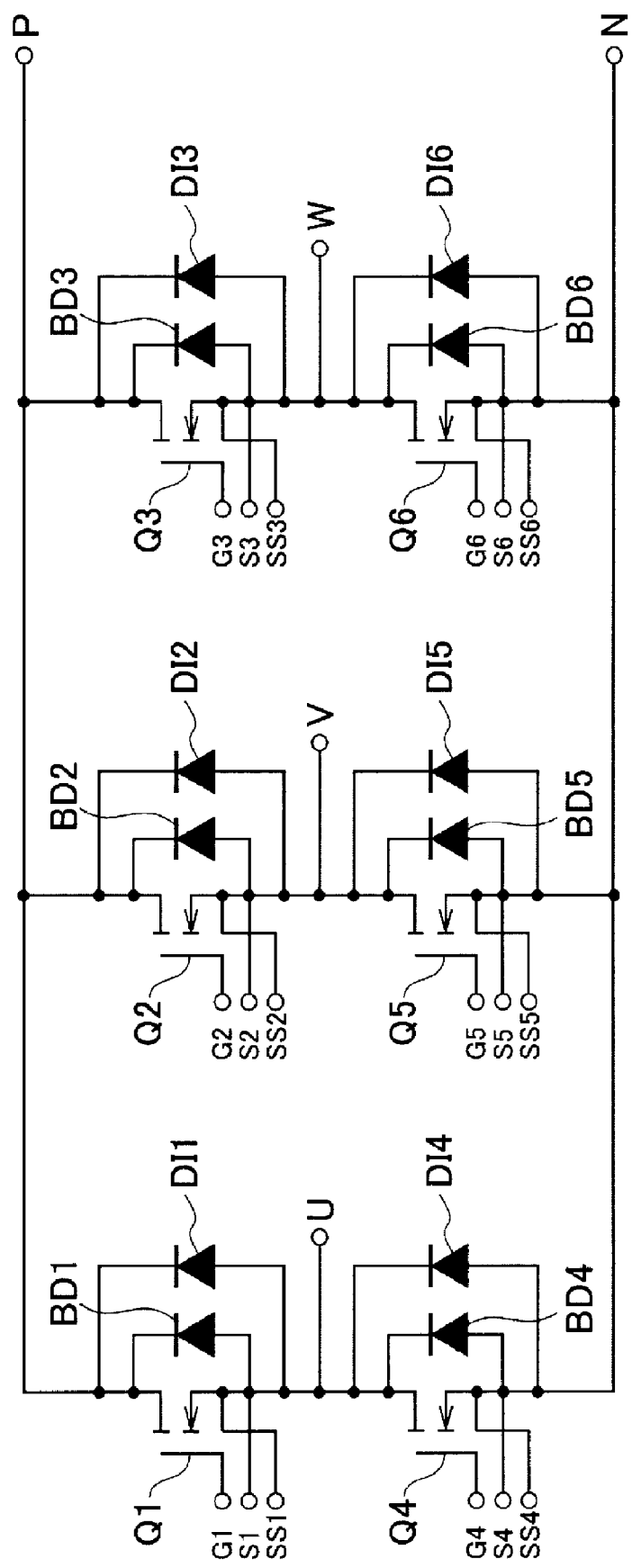
FIG. 22 is a circuit configuration view of the three-phase AC inverter configured using the intelligent power module according to the first embodiment.

The three-phase AC inverter 101B shown in FIG. 22 shows the circuit configuration of the three-phase AC inverter 101A shown in FIG. 21 in more detail. The SiC MOSFETs Q1 to Q6 include body diodes BD1 to BD6, respectively. Free-wheel diodes DI1 to DI6 are connected in anti-parallel between the sources and drains of the SiC MOSFETs Q1 to Q6, respectively.

Instead of the freewheel diodes DI1 to DI6, for example, Schottky barrier diodes may be connected in anti-parallel.

(Circuit Configuration)

Next, the circuit configuration example of the power semiconductor module 130, which is applicable to the IPM 101 according to the first embodiment, will be described in more detail.

Description will now be made on a power semiconductor module $130_1$ applicable to the IPM 101 according to the first embodiment, which is a semiconductor package device called a two-in-one type module, in which two semiconductor devices Q1 and Q4 are molded in one package 132.

Figure 23A:
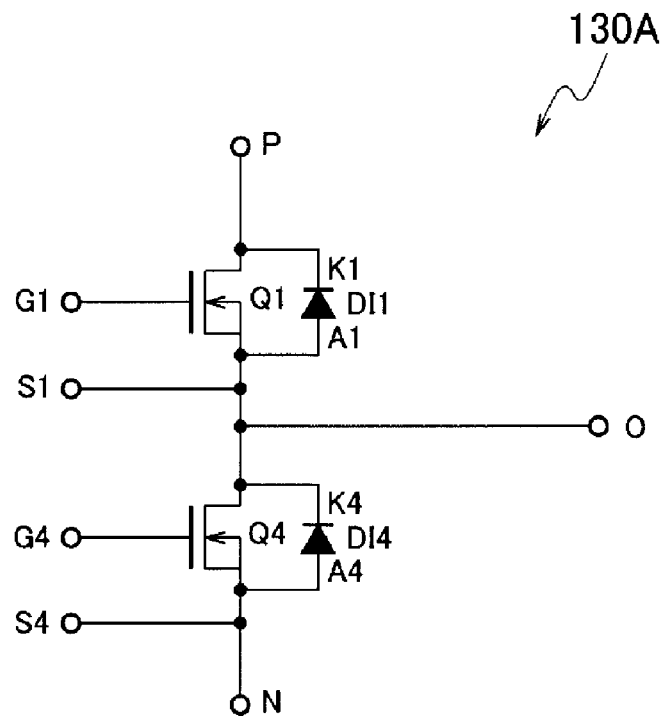
FIGS. 23A and 23B show an example of a power semiconductor module applicable to the intelligent power module according to the first embodiment.

The circuit configuration of a two-in-one module 130A to which SiC MOSFETs are applied as the semiconductor devices Q1 and Q4 is represented, for example, as shown in FIG. 23A.

As shown in FIG. 23A, the two-in-one module 130A has a configuration of a half bridge embedded module in which two SiC MOSFETs Q1 and Q4 are embedded as one module.

The module may be regarded as one large transistor. However, in some cases, the transistor of one or plural chips may be embedded. That is, a one-in-one module, a two-in-one module in which two transistors (chips) are embedded in one module, a four-in-one module in which two sets of the two-in-one modules are embedded in one module, a six-in-one module in which three sets of the two-in-one modules are embedded in one module, and the like may be used.

As shown in FIG. 23A, in the two-in-one module 130A, two SiC MOSFETs Q1 and Q4 and two diodes DI1 and DI4 connected in anti-parallel to the SiC MOSFETs Q1 and Q4 are embedded as one module. In FIG. 23A, G1 is a lead terminal for a gate signal of the SiC MOSFET Q1, and S1 is a lead terminal for a source signal of the SiC MOSFET Q1. Similarly, G4 is a lead terminal for a gate signal of the SiC MOSFET Q4, and S4 is a lead terminal for a source signal of the SiC MOSFET Q4. In addition, P is a positive-side power supply input terminal electrode, N is a negative-side power supply input terminal electrode, and O is an output terminal electrode.

Figure 23B:
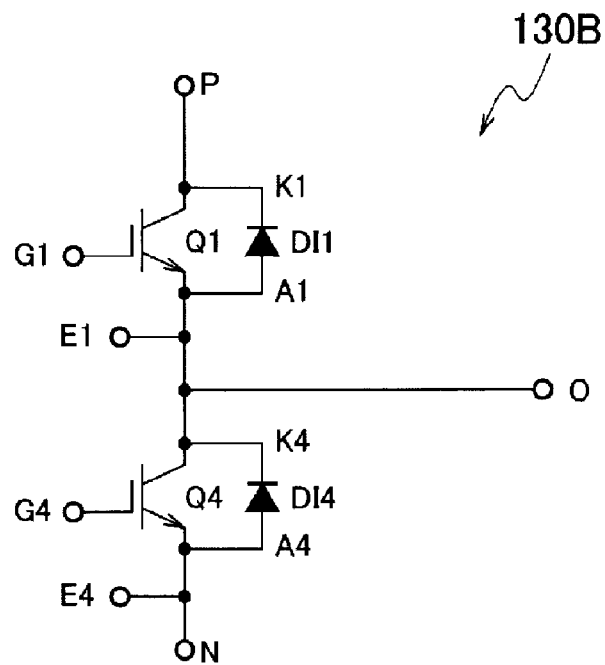

Further, the circuit configuration of the power semiconductor module $130_1$ applicable to the IPM 101 according to the first embodiment, which is a two-in-one module 130B to which IGBTs (Insulated Gate Bipolar Transistors) are applied as the semiconductor devices Q1 and Q4, is represented as shown in FIG. 23B.

As shown in FIG. 23B, in the two-in-one module 130B, two IGBTs Q1 and Q4 and two diodes DI1 and DI4 connected in anti-parallel to the IGBTs Q1 and Q4 are embedded as one module. In FIG. 23B, G1 is a lead terminal for a gate signal of the IGBT Q1, and E1 is a lead terminal for an emitter signal of the IGBT Q1. Similarly, G4 is a lead terminal for a gate signal of the IGBT Q4, and E4 is a lead terminal for an emitter signal of the IGBT Q4. In addition, P is a positive-side power supply input terminal electrode, N is a negative-side power supply input terminal electrode, and O is an output terminal electrode.

The semiconductor devices Q2 and Q5 for the power semiconductor module $130_2$ and the semiconductor devices Q3 and Q6 for the power semiconductor module $130_3$, which are applicable to the IPM 101 according to the first embodiment, may have similar configurations. Thus, the detailed description thereof will be omitted.

(Device Structure)

Figure 24A:
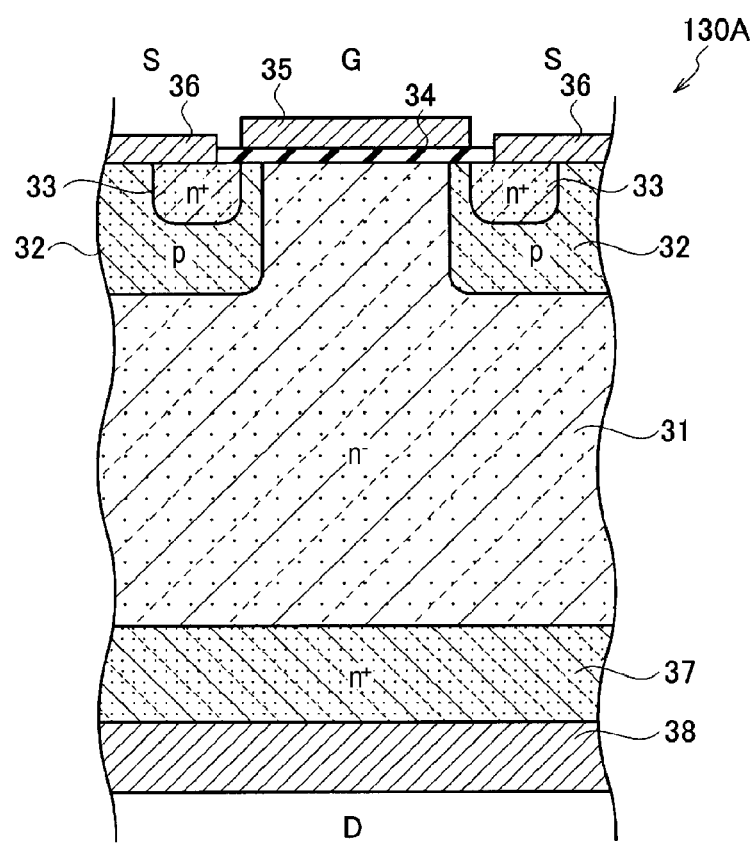
FIGS. 24A and 24B show an example of a power semiconductor module applicable to the intelligent power module according to the first embodiment.
Figure 24B:
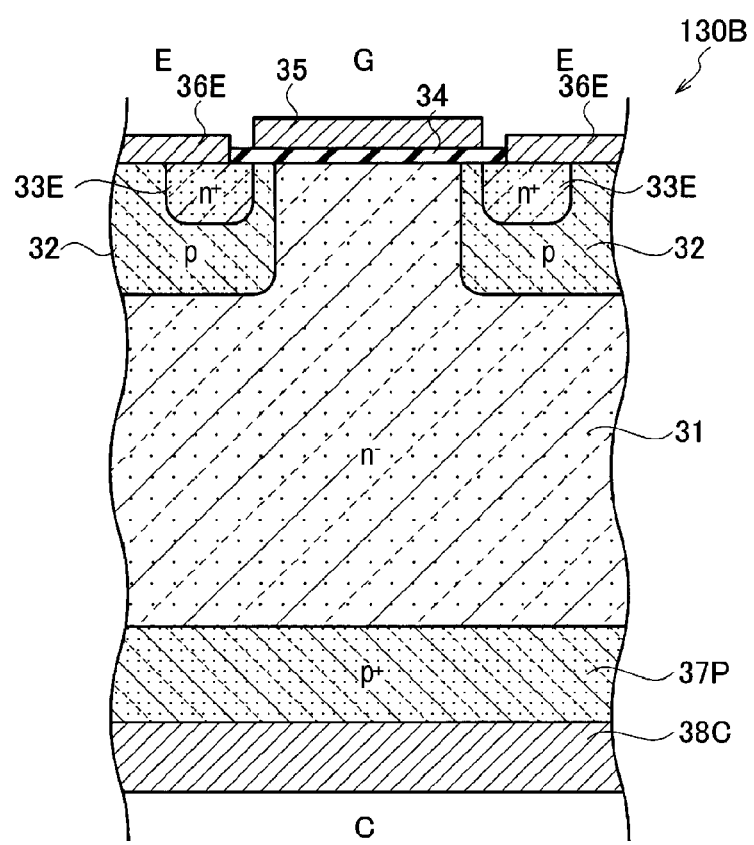

As a device structure of the power semiconductor module $130_1$ applicable to the IPM 101 according to the first embodiment, the schematic sectional structure of the SiC MOSFET 130A to be applied as the semiconductor devices Q1 and Q4 is represented as shown in FIG. 24A and the schematic sectional structure of the IGBT 130B is represented as shown in FIG. 24B.

As shown in FIG. 24A, the SiC MOSFET 130A includes a semiconductor substrate 31 composed of an n⁻ high resistance layer, p body regions 32 formed on a surface side of the semiconductor substrate 31, source regions 33 formed on a surface of the p body regions 32, a gate insulating film 34 disposed on the surface of the semiconductor substrate 31 between the p body regions 32, a gate electrode 35 disposed on the gate insulating film 34, source electrodes 36 connected to the source regions 33 and the p body regions 32, an n⁺ drain region 37 disposed on a back side opposite to the surface of the semiconductor substrate 31, and a drain electrode 38 connected to the n⁺ drain region 37.

Figure 28:
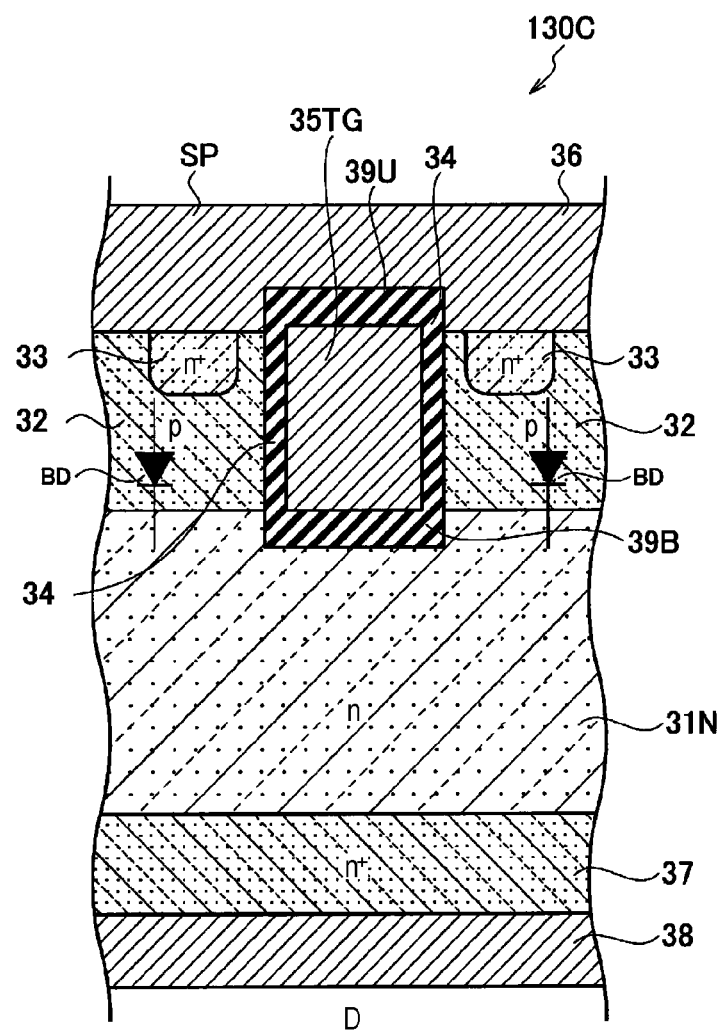
FIG. 28 is a schematic sectional structural view of a SiC T MOSFET, which is an example of a power semiconductor module applicable to the intelligent power module according to the first embodiment.

In FIG. 24A, the SiC MOSFET 130A is configured as a planar gate type n-channel vertical SiC MOSFET. However, as shown in FIG. 28 to be described later, the SiC MOSFET 130A may be configured as a trench gate type n channel vertical type SiC T (Trench) MOSFET 130C or the like.

Alternatively, for the semiconductor devices Q1 and Q4 applied to the power semiconductor module $130_1$ applicable to the IPM 101 according to the first embodiment, it may be possible to adopt a GaN-based FET or the like, instead of the SiC MOSFET 130A.

The semiconductor devices Q2 and Q5 for the power semiconductor module $130_2$ and the semiconductor devices Q3 and Q6 for the power semiconductor module $130_3$, which are applicable to the IPM 101 according to the first embodiment, may have similar configurations.

Furthermore, as the semiconductor devices Q1 to Q6 applied to the power semiconductor module 130 that is applicable to the IPM 101 according to the first embodiment, it may be possible to use a semiconductor having a band gap energy of, for example, 1.1 eV to 8 eV.

Similarly, as shown in FIG. 24B, the IGBT 130B to be applied as the semiconductor devices Q1 and Q4, which is the power semiconductor module $130_1$ applicable to the IPM 101 according to the first embodiment, includes a semiconductor substrate 31 composed of an n⁻ high resistance layer, p body regions 32 formed on a surface side of the semiconductor substrate 31, emitter regions 33E formed on surfaces of the p body regions 32, a gate insulating film 34 disposed on the surface of the semiconductor substrate 31 between the p body regions 32, a gate electrode 35 disposed on the gate insulating film 34, emitter electrodes 36E connected to the emitter regions 33E and the p body regions 32, a p⁺ collector region 37P arranged on a back surface opposite to the surface of the semiconductor substrate 31, and a collector electrode 38C connected to the p⁺ collector region 37P.

In FIG. 24B, the IGBT 130B is configured as a planar gate type n channel vertical type IGBT. However, the IGBT 130B may be configured as a trench gate type n channel vertical type IGBT or the like.

Figure 25:
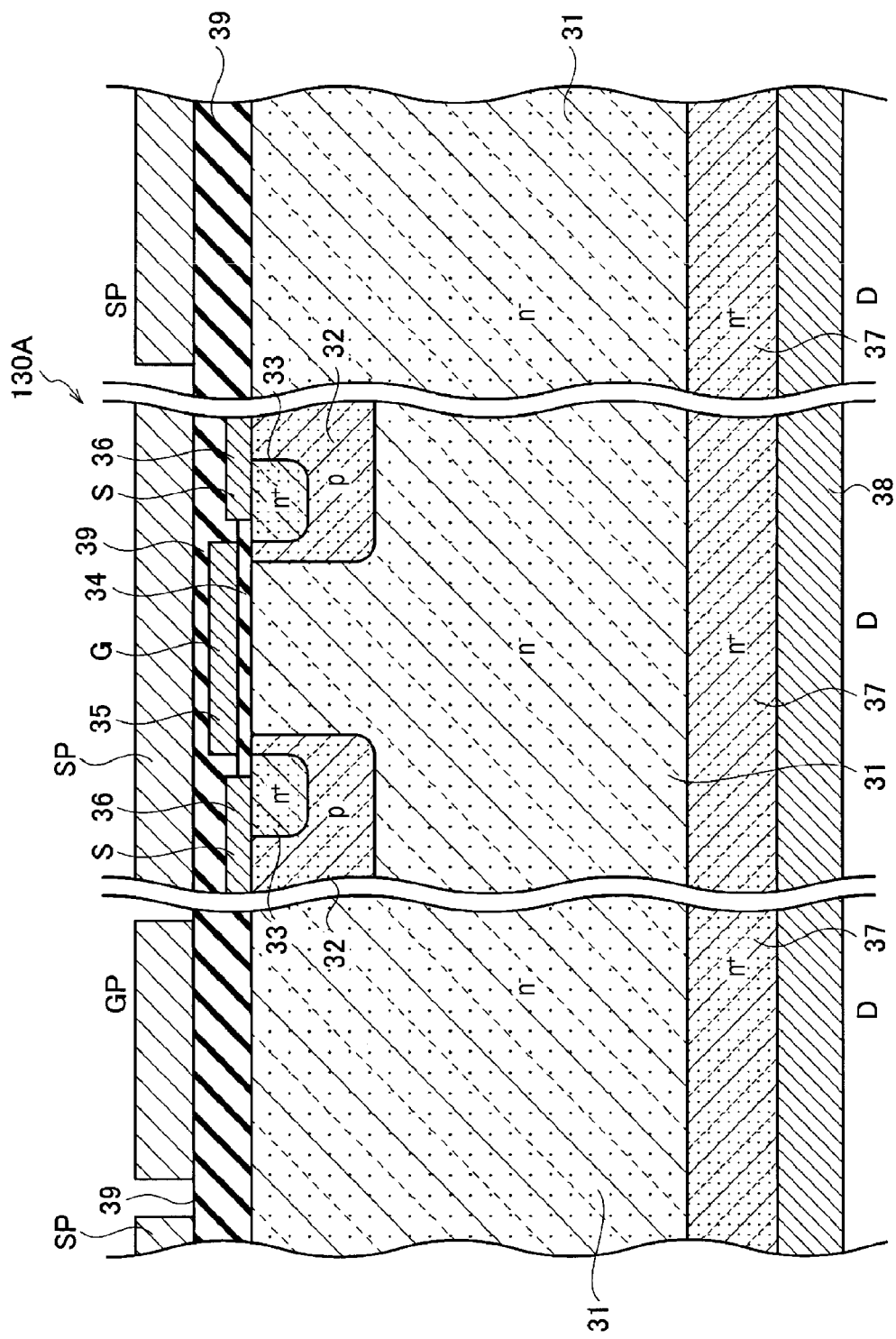
FIG. 25 is a schematic sectional structural view of a SiC MOSFET including a source pad electrode SP and a gate pad electrode GP, which is an example of a power semiconductor module applicable to the intelligent power module according to the first embodiment.

The schematic sectional structure of the SiC MOSFET 130A including the source pad electrode SP and the gate pad electrode GP, which is an example of the semiconductor devices Q1 and Q4 applied to the power semiconductor module $130_1$ applicable to the IPM 101 according to the first embodiment, is represented as shown in FIG. 25.

The gate pad electrode GP is connected to the gate electrode 35 disposed on the gate insulating film 34, and the source pad electrode SP is connected to the source electrode 36 connected to the source regions 33 and the p body regions 32. As shown in FIG. 25, the gate pad electrode GP and the source pad electrode SP are disposed on a passivation-purpose interlayer insulating film 39 that covers the surface of the SiC MOSFET 130A.

While not specifically shown, a fine transistor structure, which is similar to a central portion of FIG. 24A, may be formed in the semiconductor substrate 31 under the gate pad electrode GP and the source pad electrode SP.

Figure 26:
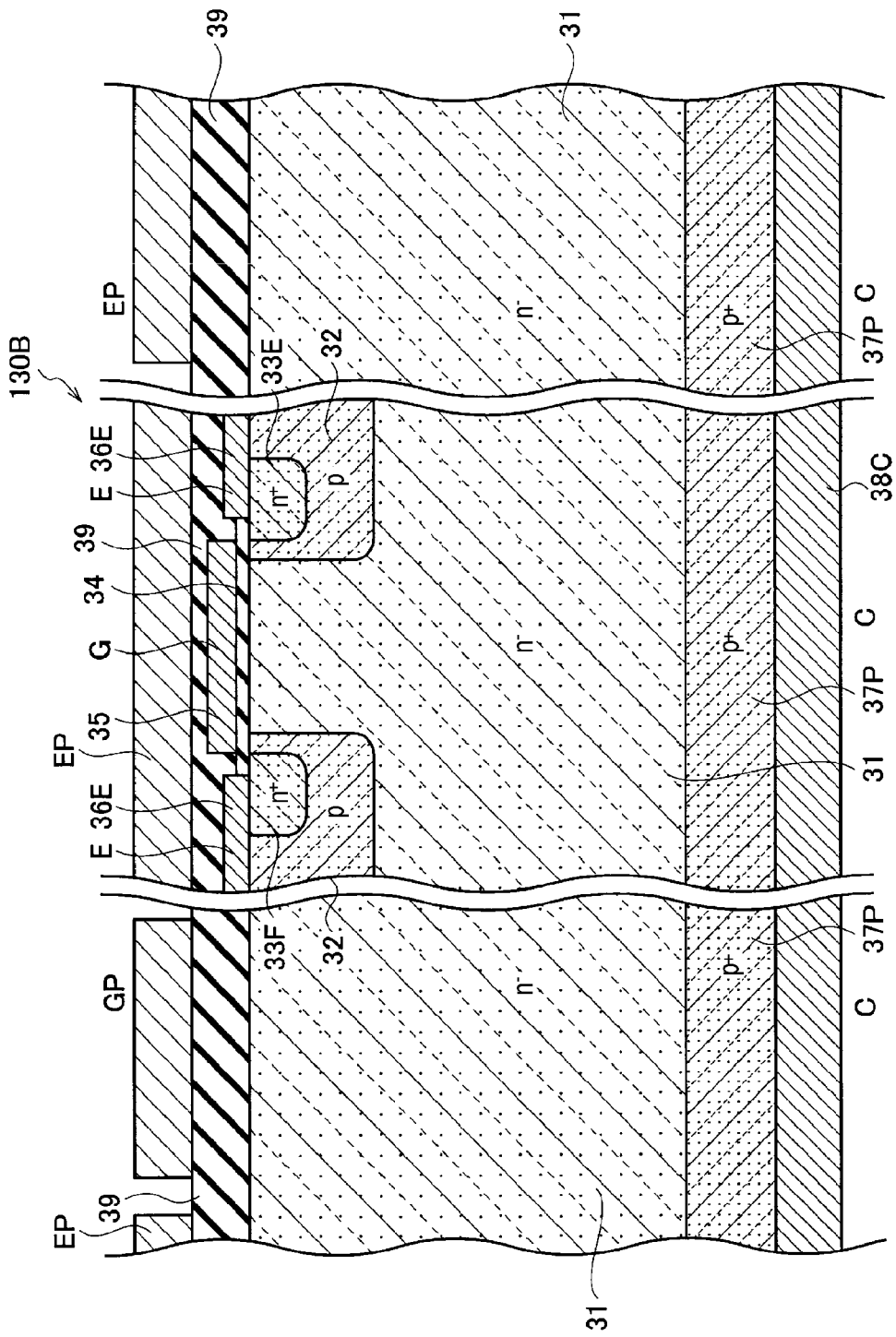
FIG. 26 is a schematic sectional structural view of an IGBT including an emitter pad electrode EP and a gate pad electrode GP, which is an example of a power semiconductor module applicable to the intelligent power module according to the first embodiment.

Further, as shown in FIG. 26, in the transistor structure at a central portion, the source pad electrode SP may be disposed to extend on the passivation-purpose interlayer insulating film 39.

The schematic sectional structure of the IGBT 130B including the emitter pad electrode EP and the gate pad electrode GP, which is an example of the semiconductor devices Q1 and Q4 applied to the power semiconductor module $130_1$ applicable to the IPM 101 according to the first embodiment, is represented as shown in FIG. 26.

The gate pad electrode GP is connected to the gate electrode 35 disposed on the gate insulating film 34, and the emitter pad electrode EP is connected to the emitter electrode 36E connected to the emitter regions 33E and the p body regions 32. As shown in FIG. 26, the gate pad electrode GP and the emitter pad electrode EP are disposed on the passivation-purpose interlayer insulating film 39 that covers the surface of the IGBT 130B.

While not specifically shown, a fine IGBT structure, which is similar to a central portion of FIG. 24B, may be formed in the semiconductor substrate 31 under the gate pad electrode GP and the emitter pad electrode EP.

Further, as shown in FIG. 26, in the IGBT structure at a central portion, the emitter pad electrode EP may be disposed to extend on the passivation-purpose interlayer insulating film 39.

The semiconductor devices Q2 and Q5 for the power semiconductor module $130_2$ and the semiconductor devices Q3 and Q6 for the power semiconductor module $130_3$, which are applicable to the IPM 101 according to the first embodiment, may have similar configurations.

As the semiconductor devices Q1 to Q6, it may be possible to use SiC-based power devices such as SiC DI (Double Implanted) MOSFETs, SiC T MOSFETs or the like, or GaN-based power devices such as GaN-based high electron mobility transistors (HEMTs) or the like. In some cases, it may be also possible to use power devices such as Si-based MOSFETs or IGBTs or the like.

—SiC DI MOSFET—

Figure 27:
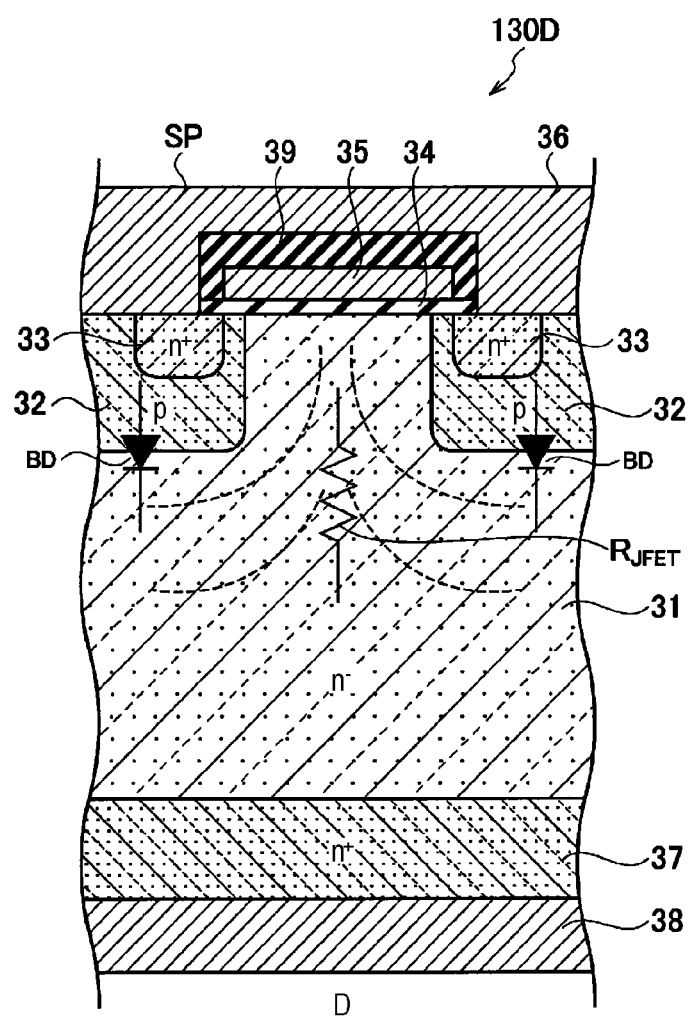
FIG. 27 is a schematic sectional structural view of a SiC DI MOSFET, which is an example of a power semiconductor module applicable to the intelligent power module according to the first embodiment.

The schematic sectional structure of the SiC DI MOSFET 130D, which is an example of the power semiconductor module 130 applicable to the IPM 101 according to the first embodiment, is represented as shown in FIG. 27.

As shown in FIG. 27, the SiC DI MOSFET 130D applied to the power semiconductor module 130 applicable to the IPM 101 according to the first embodiment includes a semiconductor substrate 31 composed of an n⁻ high resistance layer, p body regions 32 formed on a surface side of the semiconductor substrate 31, n⁺ source regions 33 formed on the surfaces of the p body regions 32, a gate insulating film 34 disposed on the surface of the semiconductor substrate 31 between the p body regions 32, a gate electrode 35 disposed on the gate insulating film 34, a source electrode 36 connected to the source regions 33 and the p body regions 32, an n⁺ drain region disposed on a back surface opposite to the surface of the semiconductor substrate 31, and a drain electrode 38 connected to the n⁺ drain region 37.

Referring to FIG. 27, in the SiC DI MOSFET 130D, the p body regions 32 and the n+ source regions 33 on the surfaces of the p body regions 32 are formed by double ion implantation (DII). A source pad electrode SP is connected to the source electrode 36 connected to the source regions 33 and the p body regions 32.

While not shown in the drawings, a gate pad electrode GP is connected to the gate electrode 35 disposed on the gate insulating film 34. Further, the gate pad electrode GP and the source pad electrode SP, as shown in FIG. 27, are disposed on the passivation-purpose interlayer insulating film 39 so as to cover the surface of the SiC DI MOSFET 130D.

In the SiC DI MOSFET, as shown in FIG. 27, a depletion layer as indicated by a broken line is formed in the semiconductor substrate 31 composed of an n− high resistance layer sandwiched between the p body regions 32. Thus, a channel resistor $R_{JFET}$ attributable to a junction type FET (JFET) effect is formed. As shown in FIG. 27, body diodes BD are formed between the p body regions 32 and the semiconductor substrate 31.

—SiC T MOSFET—

The schematic sectional structure of the SiC T MOSFET, which is an example of the semiconductor device applied to the power semiconductor module 130 applicable to the IPM 101 according to the first embodiment, is represented as shown in FIG. 28.

As shown in FIG. 28, the SiC T MOSFET 130C applied to the power semiconductor module 130 applicable to the IPM 101 according to the first embodiment includes a semiconductor substrate 31N composed of an n layer, p body regions 32 formed on a surface side of the semiconductor substrate 31N, n+ source regions 33 formed on the surfaces of the p body regions 32, a trench gate electrode 35TG formed in a trench configured to penetrate the p body regions 32 up to the semiconductor substrate 31N via a gate insulating film 34 and interlayer insulating films 39U and 39B, a source electrode 36 connected to the source regions 33 and the p body regions 32, an n+ drain region 37 disposed on a back surface opposite to the surface of the semiconductor substrate 31N, and a drain electrode 38 connected to the n+ drain region 37.

Referring to FIG. 28, in the SiC T MOSFET 130C, the trench gate electrode 35TG is formed in the trench configured to penetrate the p body regions 32 up to the semiconductor substrate 31N via the gate insulating film 34 and the interlayer insulating films 39U and 39B. The source pad electrode SP is connected to the source electrode 36 connected to the source regions 33 and the p body regions 32.

While not shown in the drawings, a gate pad electrode GP is connected to the trench gate electrode 35TG disposed on the gate insulating film 34. Further, the gate pad electrode GP and the source pad electrode SP, as shown in FIG. 28, are disposed on the passivation-purpose interlayer insulating film 39U so as to cover the surface of the SiC T MOSFET 130C.

In the SiC T MOSFET 130C, a channel resistor $R_{JFET}$ attributable to a junction type FET (JFET) effect as in the SiC DI MOSFET 130D is not formed. Similarly to FIG. 17, body diodes BD are formed between the p body regions 32 and the semiconductor substrate 31N.

Application Example

Figure 29A:
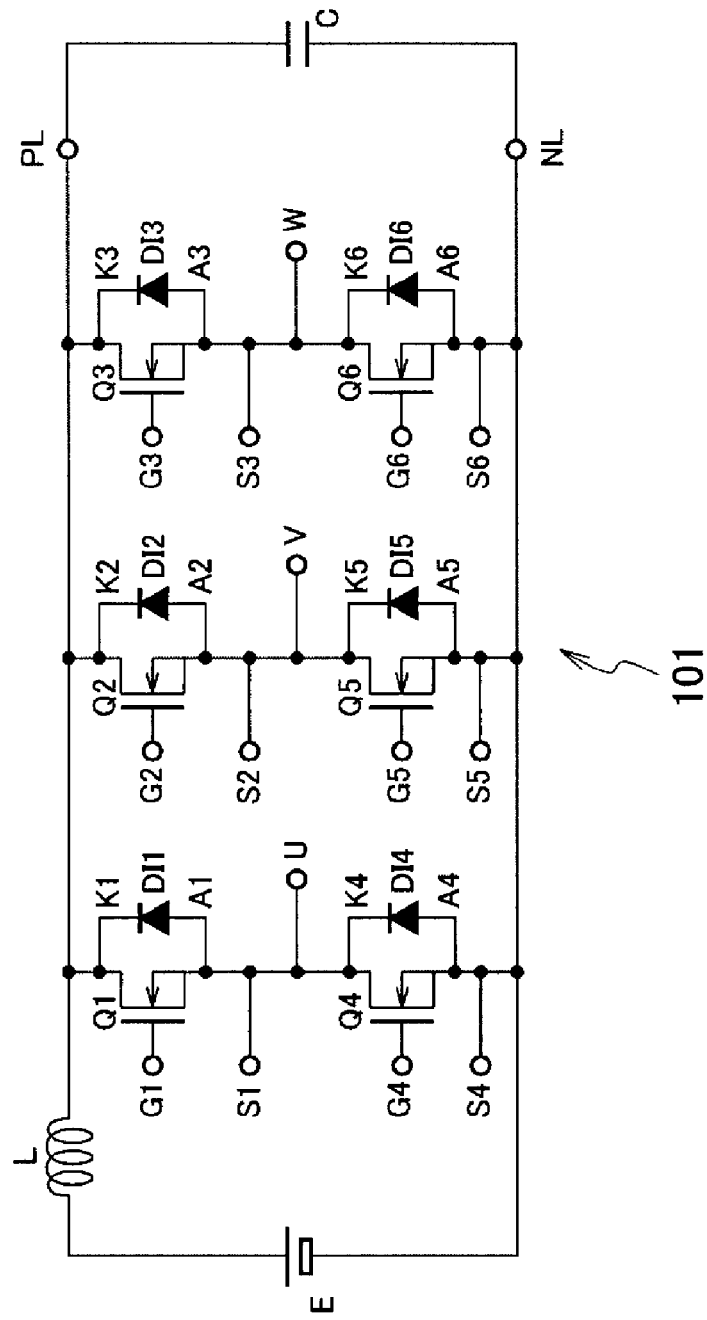
FIGS. 29A and 29B show circuit configurations of a three-phase AC inverter configured using the intelligent power module according to the first embodiment.

A circuit configuration example of a three-phase AC inverter 40A configured using the IPM 101 according to the first embodiment, in which SiC MOSFETs are used as semiconductor devices and a snubber capacitor C is connected between a power supply terminal PL and a ground terminal NL, is represented as shown in FIG. 29A.

Figure 29B:
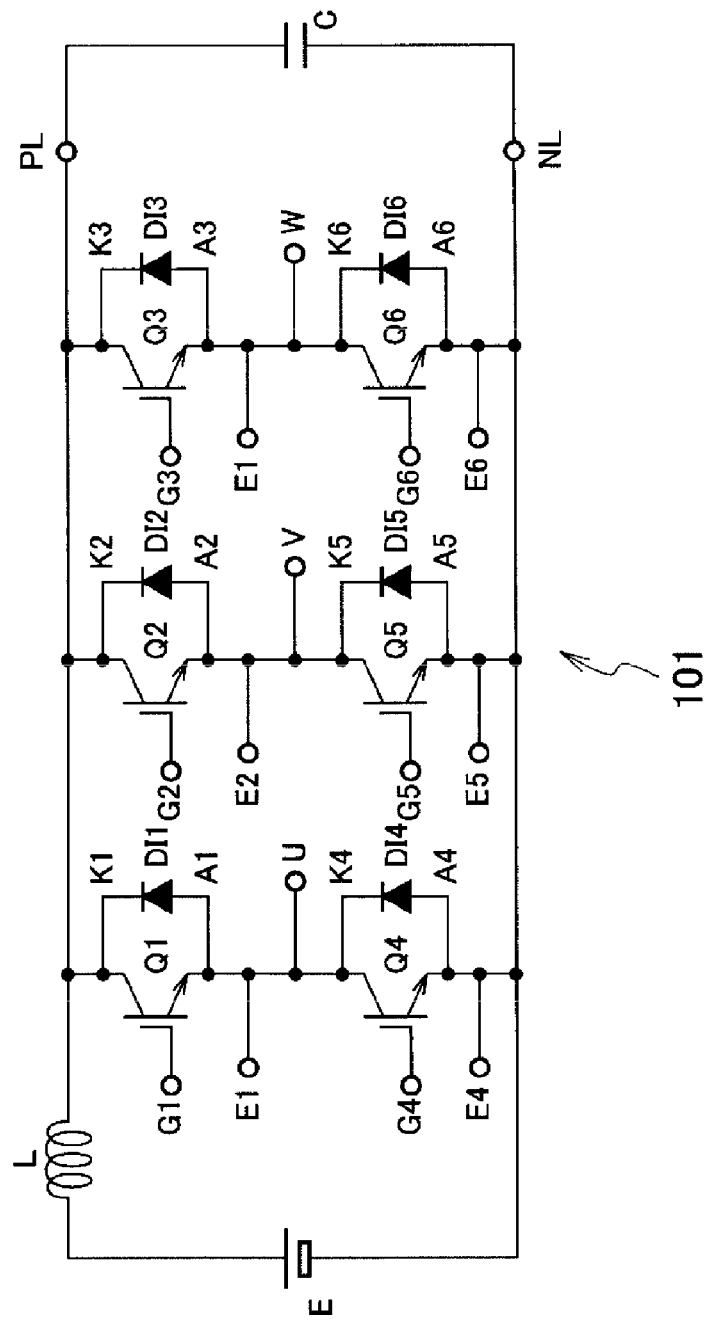

In addition, a circuit configuration example of a three-phase AC inverter 40B configured using the IPM 101 according to the first embodiment, in which IGBTs are used as semiconductor devices and a snubber capacitor C is connected between a power supply terminal PL and a ground terminal NL is represented as shown in FIG. 29B.

When the IPM 101 according to the first embodiment is connected to a power source E, a large surge voltage Ldi/dt is generated by the inductance L of a connection line because the switching speed of the SiC MOSFETs or the IGBTs is fast. For example, di/dt=3×10⁹ (A/s) where the current change di=300 A and the switching time change dt=100 nsec.

The value of the surge voltage Ldi/dt varies depending on the value of the inductance L. The surge voltage Ldi/dt is superimposed on the power source E. This surge voltage Ldi/dt can be absorbed by the snubber capacitor C connected between the power supply terminal PL and the ground terminal NL.

Concrete Example

Next, a three-phase AC inverter 42A configured using the IPM 101 according to the first embodiment, in which SiC MOSFETs are used as semiconductor devices, will be described with reference to FIG. 30.

Figure 30:
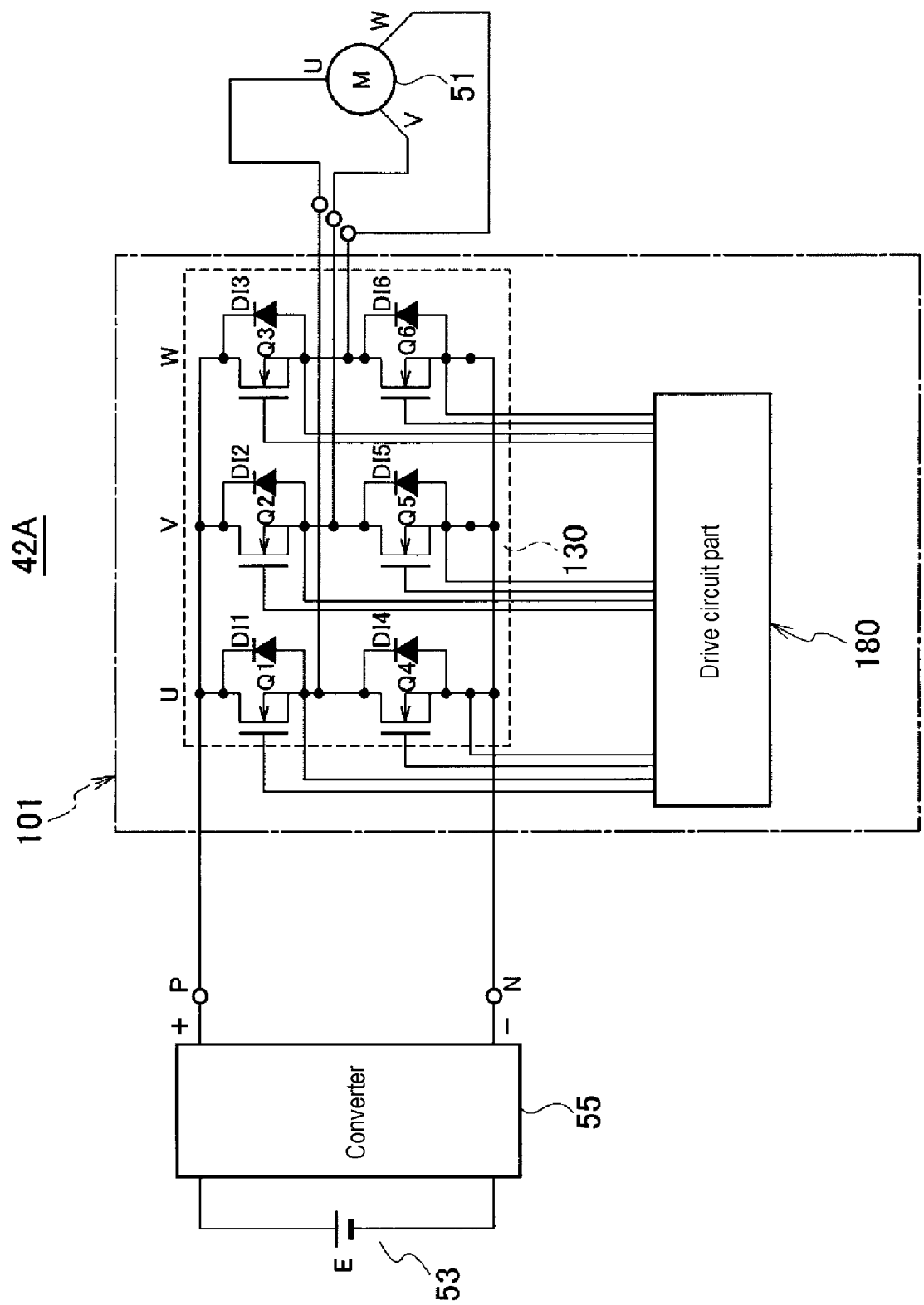
FIG. 30 is a circuit configuration view of a three-phase AC inverter configured using the intelligent power module according to the first embodiment, to which a SiC MOSFET is applied.

As shown in FIG. 30, the three-phase AC inverter 42A includes an IPM 101 having a drive circuit part 180, a three-phase AC motor part 51, a power source or storage battery (E) 53, and a converter 55. In the IPM 101, U-phase, V-phase and W-phase inverters are connected in a corresponding relationship with the U phase, V phase and W phase of the three-phase AC motor part 51.

The drive circuit part 180 is connected to the SiC MOSFETs Q1 and Q4, the SiC MOSFETs Q2 and Q5, and the SiC MOSFETs Q3 and Q6.

The IPM 101 is connected between a plus terminal (+) P and a minus terminal (−) N of the converter 55 to which the power source or storage battery (E) 53 is connected. The IPM 101 includes SiC MOSFETs Q1, Q4, Q2, Q5, Q3 and Q6. Free-wheel diodes DI' to DI6 are respectively connected in anti-parallel between the sources and drains of the SiC MOSFETs Q1 to Q6.

Next, a three-phase AC inverter 42B configured using the IPM 101 according to the first embodiment, in which IGBTs are used as semiconductor devices, will be described with reference to FIG. 31.

Figure 31:
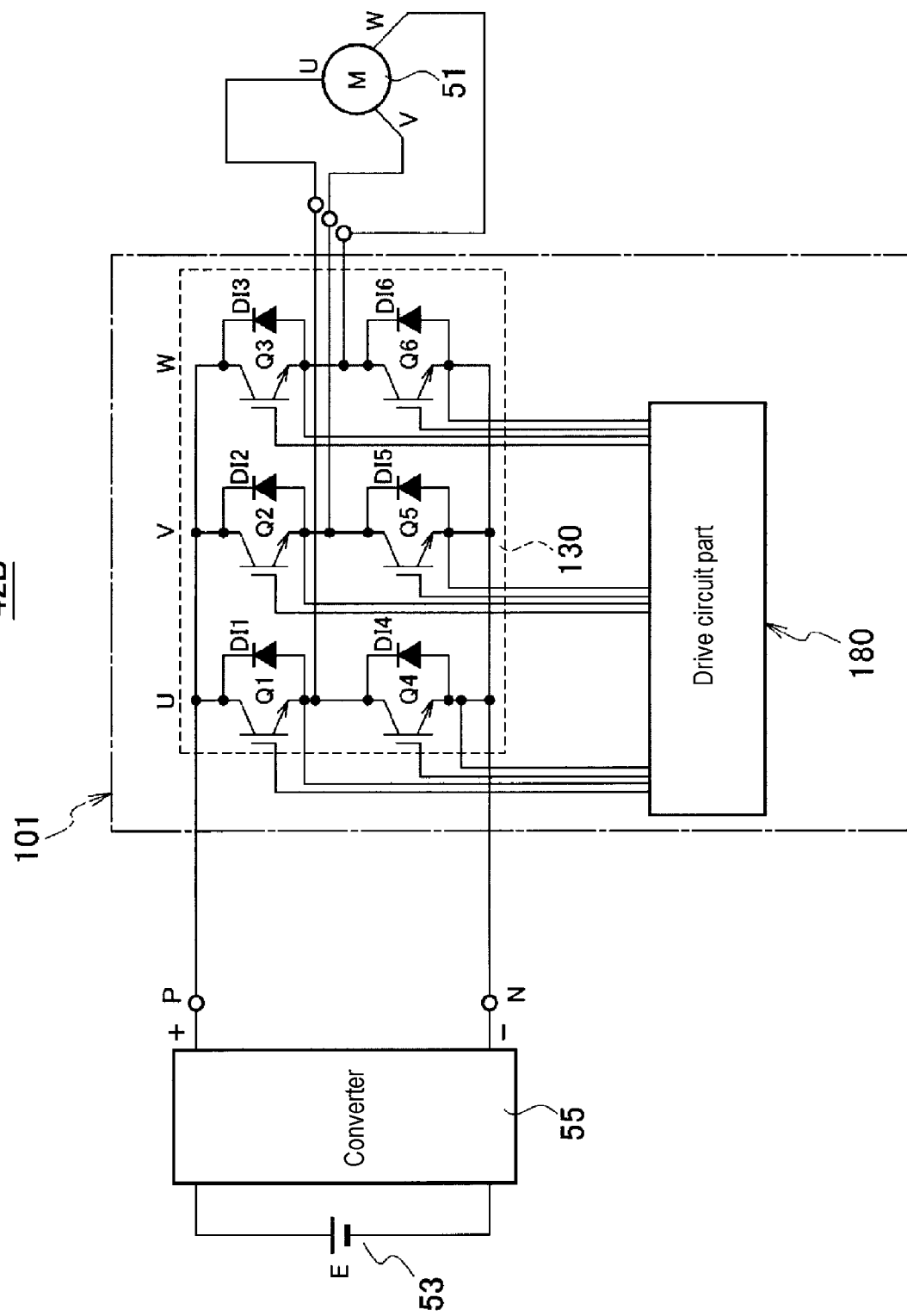
FIG. 31 is a circuit configuration view of a three-phase AC inverter configured using the intelligent power module according to the first embodiment, to which an IGBT is applied.

As shown in FIG. 31, the three-phase AC inverter 42B includes an IPM 101 having a drive circuit part 180, a three-phase AC motor part 51, a power source or storage battery (E) 53, and a converter 55. In the IPM 101, U-phase, V-phase and W-phase inverters are connected in a corresponding relationship with the U phase, V phase and W phase of the three-phase AC motor part 51.

The drive circuit part 180 is connected to the IGBTs Q1 and Q4, the IGBTs Q2 and Q5, and the IGBTs Q3 and Q6.

The IPM 101 is connected between a plus terminal (+) P and a minus terminal (−) N of the converter 55 to which the storage battery (E) 53 is connected. The IPM 101 includes IGBTs Q1, Q4, Q2, Q5, Q3 and Q6. Free-wheel diodes DI' to DI6 are respectively connected in anti-parallel between the emitters and collectors of the IGBTs Q1 to Q6.

Application Example 2

Application example 2 exemplifies another application example in which the IPM 101 according to the first embodiment is mounted on, for example, a power control unit of an electric vehicle or a hybrid vehicle. The circuit block configuration of a power control unit 60 is represented as shown in FIG. 32.

Figure 32:
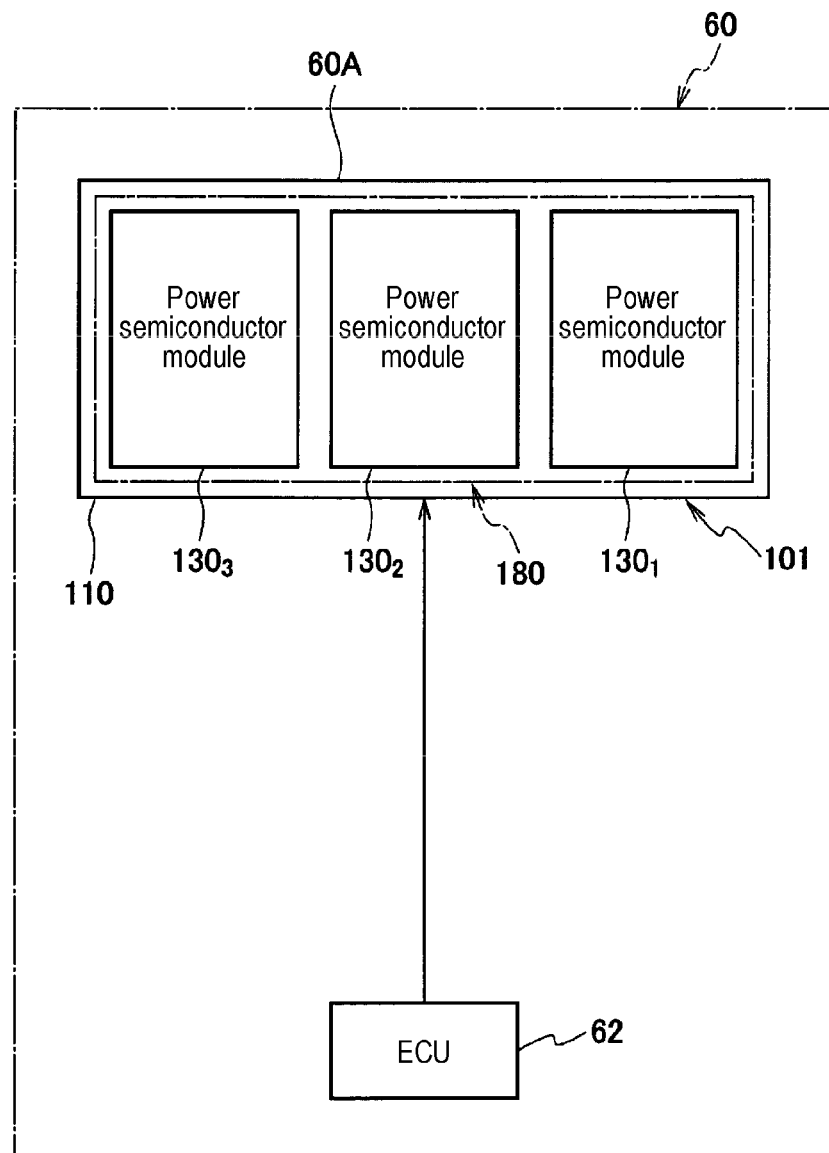
FIG. 32 is a schematic block configuration view showing an example in which the intelligent power module according to the first embodiment is applied to a power control unit of an electric vehicle or a hybrid vehicle.

As shown in FIG. 32, the IPM 101 capable of being mounted on the power control unit 60 of the electric vehicle or the hybrid vehicle is configured as, for example, a three-phase AC inverter 60A that supplies a three-phase drive current to a motor (not shown) serving as an engine for the motor vehicle.

The three-phase AC inverter 60A is controlled by an ECU 62 in the power control unit 60 of the electric vehicle or the hybrid vehicle, which controls the driving of the motor and the like.

In the application examples and the concrete example described above, the IPM 101 according to the first embodiment has been described as an example. However, the present disclosure invention is not limited thereto and other IPMs are also applicable.

Application Example 3

Figure 33:
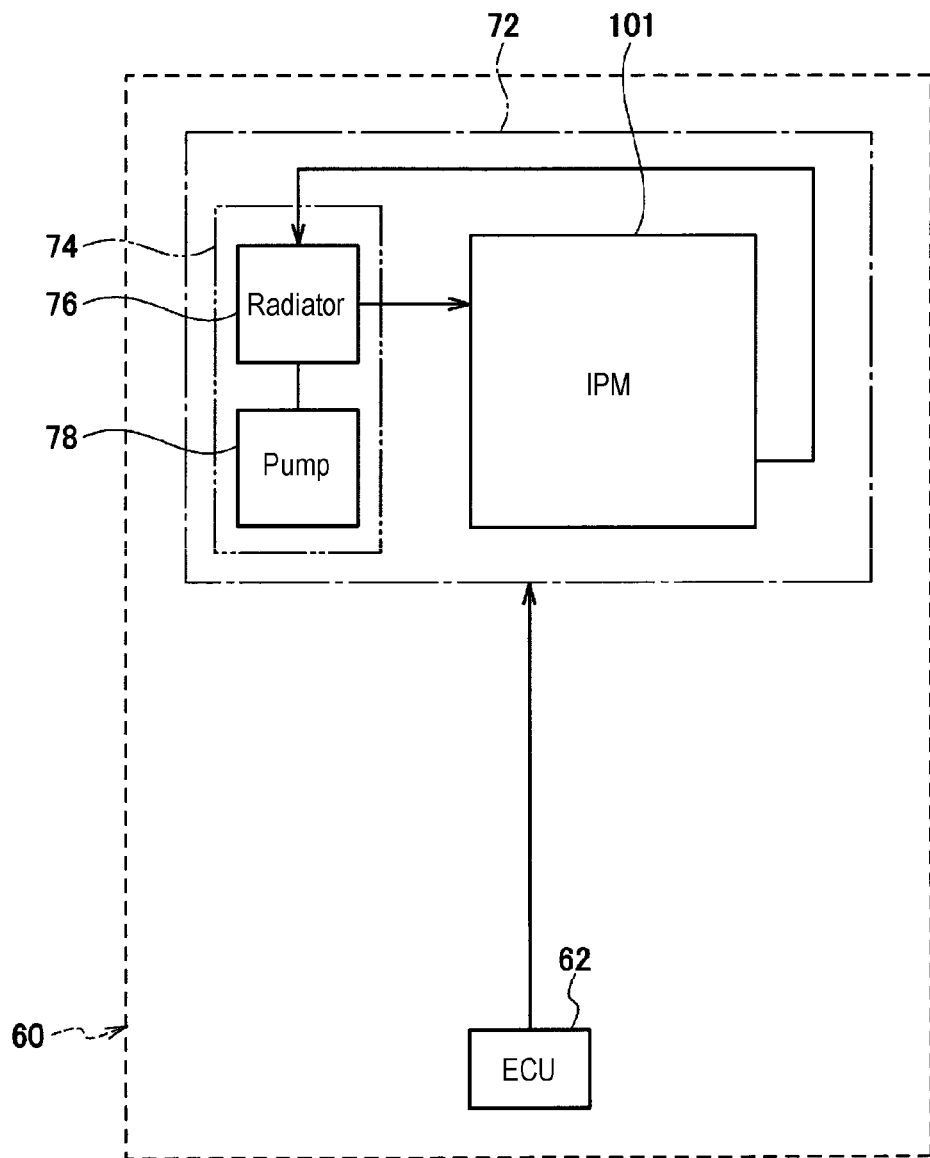
FIG. 33 is a block configuration view showing main parts of a power control unit of an electric vehicle to which the intelligent power module according to the first embodiment is applied.

Application example 3 exemplifies, for example, a power control unit 60 of an electric vehicle, to which the IPM 101 according to the first embodiment is applied and which includes a cooling mechanism part 72 including a module cooling system 74, as shown in FIG. 33.

As shown in FIG. 33, the cooling mechanism part 72 applicable to the power control unit 60 of the electric vehicle is configured to cool, for example, the IPM 101 configured as a three-phase AC inverter for supplying a three-phase drive current to a motor (not shown) serving as an engine for the vehicle, using the module cooling system 74.

In the cooling mechanism part 72, the module cooling system 74 includes a radiator 76 and a pump 78. The radiator 76 lowers the temperature of cooling water that has been raised by absorbing heat from the IPM 101 to a certain constant temperature. The pump 78 repeatedly supplies the cooling water maintained at the constant temperature by the radiator 76 to the heat radiation device 110 of the IPM 101.

The cooling mechanism part 72 having such a configuration may be controlled by, for example, an ECU 62 in the power control unit 60 of the electric vehicle, which controls the driving of the motor and the like, or may be configured to constantly cool the IPM 101 irrespective of the control of the ECU 62.

Figure 34:
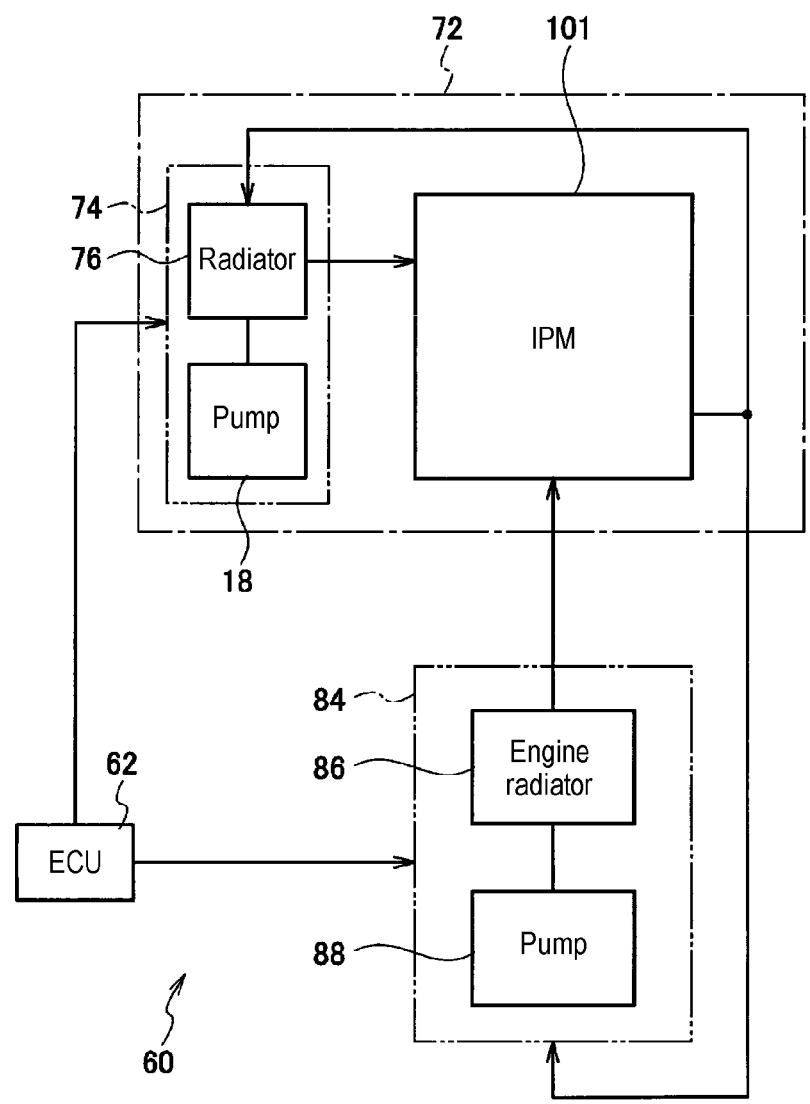
FIG. 34 is a block configuration diagram showing main parts of a power control unit of a hybrid vehicle to which the intelligent power module according to the first embodiment is applied.

When the cooling mechanism part 72 is applied to a power control unit 60 of a hybrid vehicle equipped with a vehicle engine, separately from a motor, as shown in FIG. 34, the IPM 101 may be cooled not only by the module cooling system 74, but also by a hybrid cooling system 84 mounted for engine cooling purposes, including an engine radiator 86 and a pump 88. In the hybrid vehicle in which the IPM 101 can be cooled by the hybrid cooling system 84, it is possible to allow the ECU 62 to switch between cooling by the module cooling system 74 and cooling by the hybrid cooling system 84. It is also possible to omit the mounting of the module cooling system 74 in the cooling mechanism part 72.

Not only the IPM 101 but also the IPMs 201 and 301 (except the IPM 303) according to any of the embodiments described above may be applied to the power control unit 60 of the electric or hybrid vehicle.

As described above, according to the present embodiment, it is possible to implement an IPM which is excellent in heat radiation characteristics, easy to modularize and suitable for miniaturization. Therefore, it is possible to efficiently cool a plurality of power semiconductor modules 130 and to suppress destruction of chips due to overheating and fusing of wiring lines so that an electric vehicle or a hybrid vehicle with higher reliability can be provided.

Therefore, when the IPMs 101, 201, 301 or 303 according to the first to third embodiments are to be mounted on, for example, a motor vehicle, it becomes possible to develop a highly efficient system while securing even higher safety as well as higher performance and higher functionality.

In the present embodiment, the molded power module is not limited to the three-terminal type power semiconductor module 130 having three terminal electrodes O, P, and N, and may be, for example, a four-terminal type molded power module 600 or the like as shown in FIG. 35.

Figure 35A:
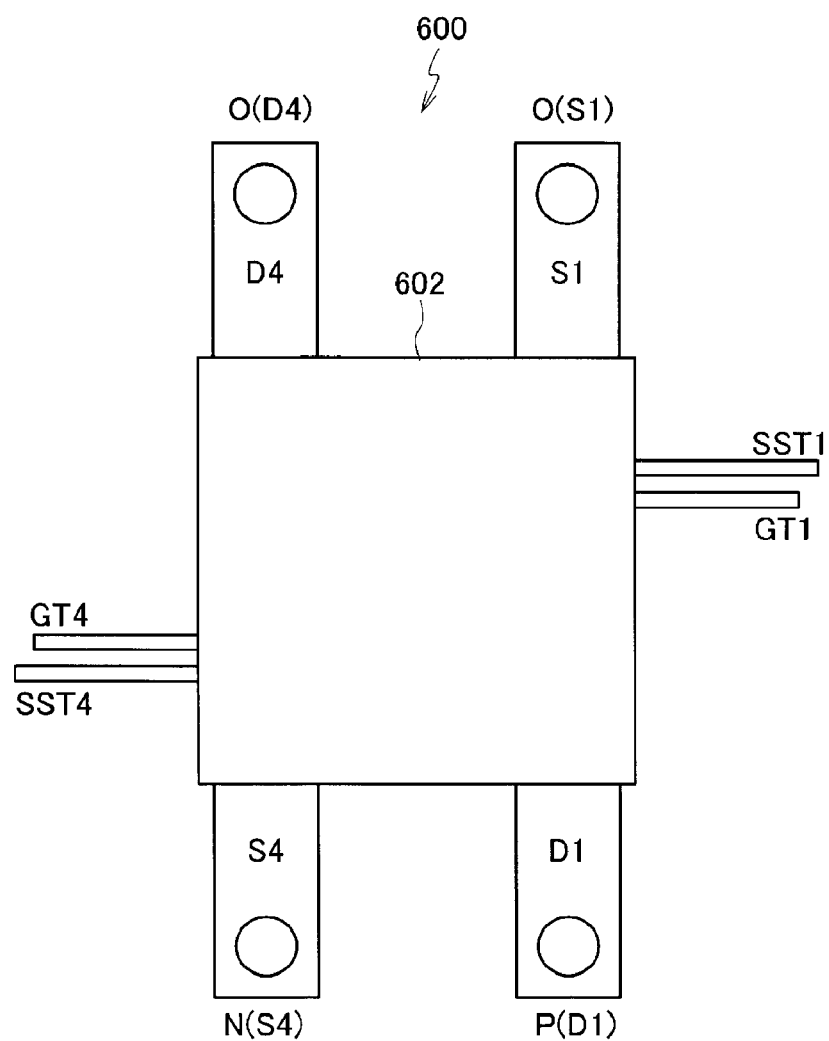
FIG. 35A is a plan view of a power semiconductor module applicable to the intelligent power module according to the embodiment.
Figure 35B:
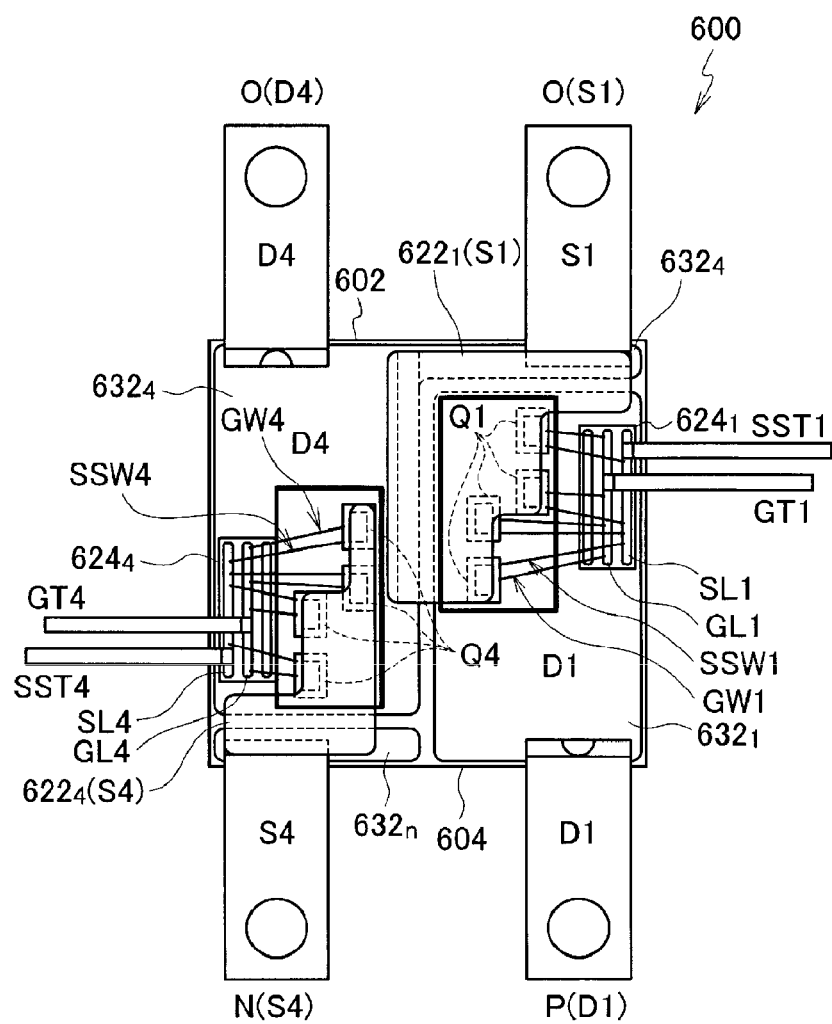
FIG. 35B is a plan pattern configuration view showing the internal structure of the power semiconductor module.

In the case of the two-in-one type four-terminal type molded power module 600 to which the SiC MOSFETs are applied, a planar configuration (outward structure) after forming a package 602 is represented as shown in FIG. 35A, and a planar pattern configuration (internal structure) before forming the package 602 is represented as shown in FIG. 35B.

That is, as shown in FIGS. 35A and 35B, the molded power module 600 has a configuration of a half bridge built-in module in which two SiC MOSFETs Q1 and Q4 are embedded. FIG. 35B shows an example in which each of SiC MOSFETs Q1 and Q4 is arranged with four chips in parallel. The SiC MOSFETs Q1 and Q4, for example, can be equipped with up to five transistors (chips) some of which may be used for diodes DI.

For example, the molded power module 600 includes a positive power input terminal D1 (drain terminal electrode P) and a negative power input terminal S4 (ground potential terminal electrode N) disposed on a first side of a ceramic substrate 604, which is covered in the package 602, a lead terminal (gate signal terminal electrode) GT1 for a gate signal and a lead terminal (source signal terminal electrode) SST1 for a source sense signal arranged on a second side adjacent to the first side, output terminal electrodes S1 (O) and D4 (O) arranged on a third side opposite the first side, and a lead terminal GT4 for a gate signal and a lead terminal SST4 for a source sense signal arranged on a fourth side opposite the second side.

As shown in FIG. 35B, the lead terminal GT1 for the gate signal and the lead terminal SST1 for the source sense signal are connected to a gate signal electrode pattern GL1 and a source signal electrode pattern SL1 of the SiC MOSFET Q1. The lead terminal GT4 for the gate signal and the lead terminal SST4 for source sense signal are connected to a gate signal electrode pattern GL4 and a source signal electrode pattern SL4 of the SiC MOSFET Q4.

Gate wires GW1 and GW4 and source sense wires SSW1 and SSW4 extend from the SiC MOSFETs Q1 and Q4 toward the gate signal electrode patterns GL1 and GL4 and the source signal electrode patterns SL1 and SL4 arranged on the signal substrates $624_1$ and $624_4$. The lead terminals GT1 and GT4 for gate signals and the lead terminals SST1 and SST4 for source sense signals, which are used for extraction to the outside, are connected to the gate signal electrode patterns GL1 and GL4 and the source signal electrode patterns SL1 and SL4 by soldering or the like.

The sources S1 and S4 of the SiC MOSFETs Q1 and Q4 arranged with the four chips in parallel are connected in common by upper plate electrodes $622_1$ and $622_4$.

While not shown in the drawings, diodes may be connected in anti-parallel between the drains D1 and the sources S1 of the SiC MOSFETs Q1 and Q4 and between the drains D4 and the sources S4 of the SiC MOSFETs Q1 and Q4.

The molded power module applicable to the power semiconductor module of the IPM according to the present embodiment is not limited to the SiC-based power device (semiconductor device). A GaN-based power device or a Si-based power device may be adopted.

Further, the present disclosure is not limited to a power module molded with a resin, but may also be applied to a power module (a semiconductor package device) packaged by a case type package.

Furthermore, the semiconductor device to be embedded in the power module is not limited to one chip. For example, as in a power module 700 shown in FIGS. 36A and 36B, in addition to the semiconductor devices (Q), other electronic components such as diodes D1 or the like may be included.

Figure 36A:
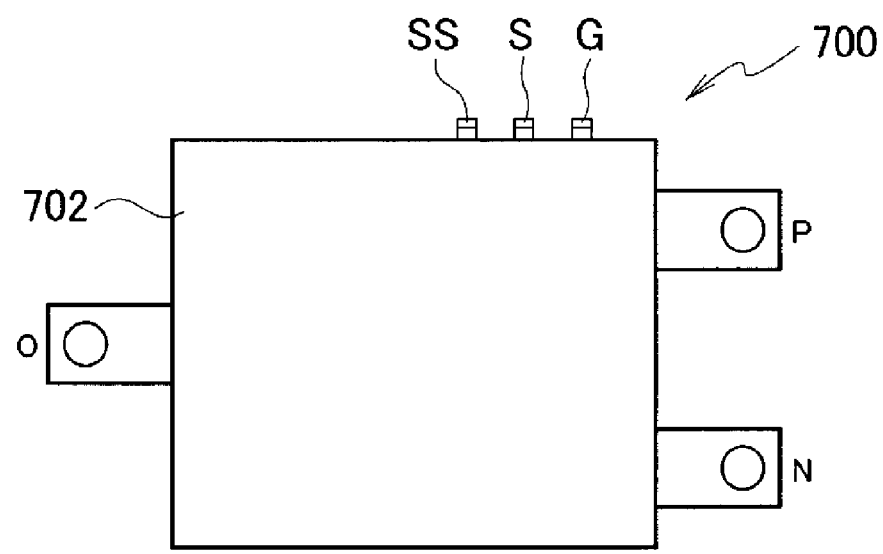
FIG. 36A is a plan view of a power semiconductor module applicable to the intelligent power module according to the embodiment.
Figure 36B:
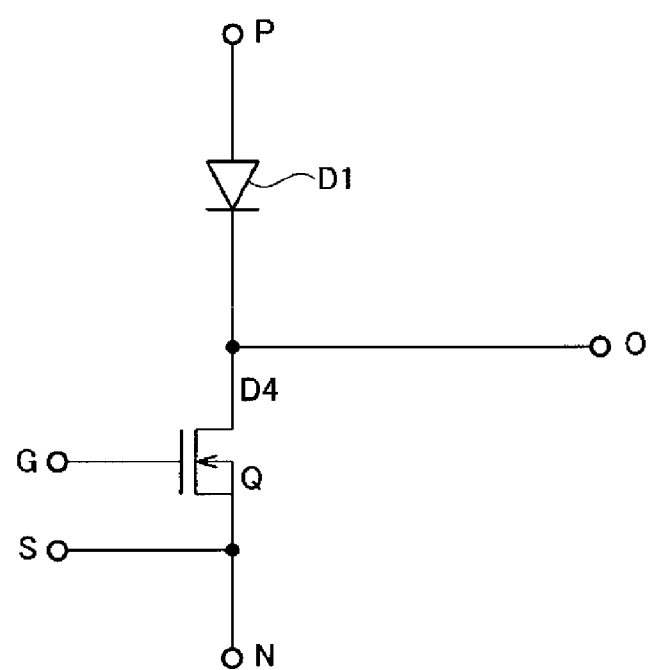
FIG. 36B is a circuit expression view of the power semiconductor module.

In the power module 700, the planar configuration (outward structure) after forming a package 702 is represented as shown in FIG. 36A and the circuit configuration thereof is represented as shown in FIG. 36B.

Other Embodiments

Although a few embodiments have been described above, the description and drawings forming a part of the disclosure are illustrative and should not be understood as being limitative. Various alternative embodiments, examples and operational techniques will be apparent to those skilled in the art from this disclosure.

As described above, the present disclosure includes various embodiments which are not described herein.

The IPMs of the present embodiments may be used for techniques of manufacturing various semiconductor modules such as an IGBT module, a diode module, a MOS module (Si, SiC, GaN) and the like, and may be applied to wide application fields such as inverters for HEVs (Hybrid Electric Vehicles) and EVs (Electric Vehicles), inverters and converters for industrial use, and so forth.

According to the present disclosure in some embodiments, it is possible to provide an intelligent power module that is excellent in heat radiation characteristics, easy to modularize and suitable for miniaturization, an electric vehicle or a hybrid vehicle, and a method of assembling an intelligent power module.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A power module device, comprising:
a first heat radiation device including an integrated flow path, a front surface, and a rear surface;
a plurality of power semiconductor modules disposed in a row over the front surface of the first heat radiation device and configured to individually seal a semiconductor device circuit;
a second heat radiation device disposed over the plurality of power semiconductor modules;
a drive circuit part configured to drive the plurality of power semiconductor modules and disposed over the second heat radiation device;
a heat shield member placed between the plurality of power semiconductor modules and the drive circuit part; and
an attachment frame, disposed on the front surface of the first heat radiation device, the attachment frame comprising:
a frame body; and
a plurality of holes formed inside the frame body,
wherein the plurality of power semiconductor modules is mounted on the front surface of the first heat radiation device via respective ones of the plurality of holes,
wherein the second heat radiation device is formed of a metal plate having a heat radiation property,
wherein the metal plate is formed of Al, and
wherein the second heat radiation device has a spring property.

2. The power module device of claim 1,
wherein a power device used in the semiconductor device circuit comprises a switching element that includes an electrode and a surface on which the electrode is disposed, and
wherein at least one of the plurality of power semiconductor modules constitutes a two-in-one module.

3. The power module device of claim 1,
wherein the second heat radiation device has a through-hole, and
wherein the first heat radiation device and the second heat radiation device are thermally connected to each other via a fixture that is inserted into the through-hole.

4. The power module device of claim 1, wherein the first heat radiation device is a water-cooled cooler.

5. The power module device of claim 1, wherein the drive circuit part comprises a primary side circuit part and a secondary side circuit part that are insulated from each other.

6. The power module device of claim 1, wherein at least one of the plurality of power semiconductor modules comprises one or more semiconductor device circuits of an IGBT, a diode, a Si-based MOSFET, a SiC-based MOSFET, and a GaN-based FET.

7. The power module device of claim 1, wherein the attachment frame is made of a resin.

8. The power module device of claim 1, further comprising a joining member configured to join the plurality of power semiconductor modules on the front surface of the first heat radiation device.

9. The power module device of claim 8, wherein the joining member comprises solder configured to fix the plurality of power semiconductor modules to the front surface.

10. The power module device of claim 9, wherein the joining member comprises a thermally conductive resin configured to hold the plurality of power semiconductor modules on the front surface.

11. A power module device, comprising:
a first heat radiation device including an integrated flow path, a front surface, and a rear surface;
a plurality of power semiconductor modules, each of the plurality of power semiconductor modules constituting a two-in-one module, the plurality of power semiconductor modules being disposed in a row over the front surface of the first heat radiation device and being configured to individually seal a semiconductor device circuit therein;
a second heat radiation device disposed over the plurality of power semiconductor modules;

a drive circuit part configured to drive the plurality of power semiconductor modules and disposed over the second heat radiation device;

a heat shield member placed between the plurality of power semiconductor modules and the drive circuit part; and an attachment frame disposed on the front surface of the first heat radiation device, the attachment frame comprising:

a frame body; and a plurality of holes formed inside the frame body, wherein the plurality of power semiconductor modules is mounted on the front surface of the first heat radiation device via respective ones of the plurality of holes, wherein the plurality of power semiconductor modules constitutes a six-in-one module type inverter or converter, wherein the second heat radiation device is formed of a metal plate having a heat radiation property, wherein the metal plate is formed of Al, and wherein the second heat radiation device has a spring property.

12. The power module device of claim 1, wherein the power module device is used in a power control unit of an electric vehicle or a hybrid vehicle and is configured to operate in response to a control signal supplied from an ECU.

13. An electric vehicle or a hybrid vehicle equipped with the power module device of claim 1.

14. The electric vehicle or the hybrid vehicle of claim 13, further comprising:

an ECU configured to control an operation of the power module device; and a temperature monitoring circuit configured to monitor a temperature state of the power module device.

\* \* \* \* \*